(12) United States Patent
Yuri

(10) Patent No.: US 8,026,530 B2
(45) Date of Patent: Sep. 27, 2011

(54) SEMICONDUCTOR LIGHT-EMITTING DEVICE, LIGHTING MODULE AND LIGHTING APPARATUS

(75) Inventor: Masaaki Yuri, Osaka (JP)

(73) Assignee: Panasonic Corporation, Osaka (JP)

(*) Notice: Subject to any disclaimer, the term of this patent is extended or adjusted under 35 U.S.C. 154(b) by 238 days.

(21) Appl. No.: 11/270,604

(22) Filed: Nov. 10, 2005

(65) Prior Publication Data

US 2006/0097270 A1    May 11, 2006

(30) Foreign Application Priority Data

Nov. 11, 2004  (JP) ................................. 2004-328182

(51) Int. Cl.
*H01L 23/14* (2006.01)
(52) U.S. Cl. ............ 257/99; 257/623; 257/E33.057; 257/E25.02
(58) Field of Classification Search .......... 257/99, 257/623, E33.005, E33.006, E33.057, E33.065, 257/E21.122, E25.02; 438/26, 39, 455, 609, 438/666
See application file for complete search history.

(56) References Cited

U.S. PATENT DOCUMENTS

| 6,887,770 | B2 | 5/2005 | Ueda et al. | |
|---|---|---|---|---|
| 7,180,099 | B2* | 2/2007 | Ogihara et al. | 257/99 |
| 2006/0118510 | A1* | 6/2006 | Fujii | 216/24 |
| 2007/0114556 | A1* | 5/2007 | Ogihara et al. | 257/99 |
| 2007/0221940 | A1* | 9/2007 | Okazaki | 257/99 |
| 2009/0149000 | A1* | 6/2009 | Ogihara et al. | 438/455 |
| 2010/0038661 | A1* | 2/2010 | Chen et al. | 257/98 |

FOREIGN PATENT DOCUMENTS

| JP | 11-191642 | 7/1999 |
|---|---|---|
| JP | 11-298048 | 10/1999 |
| JP | 2000-068555 | 3/2000 |
| JP | 2000208822 A * | 7/2000 |
| JP | 2001-77422 A | 3/2001 |
| JP | 2002-289920 | 10/2002 |
| JP | 2003-234535 | 8/2003 |
| JP | 2003-309289 | 10/2003 |
| JP | 2003-347587 | 12/2003 |
| JP | 2004-006919 | 1/2004 |
| JP | 2004-048040 | 2/2004 |
| JP | 2004-179641 | 6/2004 |

OTHER PUBLICATIONS

D. Morita, et al., "High Output Power 365 nm Ultraviolet Light Emitting Diode of GaN-Free Structure," Jpn. J. Appl. Phys., Dec. 15, 2002, pp. L1434-L1436, vol. 41, Part 2, No. 12B, The Japan Society of Applied Physics.
Japanese Notice of Reasons for Rejection, w/ English translation thereof, issued in Japanese Patent Application No. JP 2004-328182 dated Apr. 14, 2009.
Japanese Office Action, with English translation, issued in Japanese Patent Application No. 2004-328182, mailed Sep. 8, 2009.

* cited by examiner

*Primary Examiner* — George Fourson, III
(74) *Attorney, Agent, or Firm* — McDermott Will & Emery LLP

(57) ABSTRACT

A semiconductor light-emitting device includes: a support; a semiconductor light-emitting element bonded to the support and comprising a first electrode, a second electrode, and a semiconductor layer including at least an active layer, at least one of the first and second electrodes overlying the semiconductor layer; and a wiring metal formed to extend from above a portion of an upper surface of the support not underlying the semiconductor light-emitting element to one said electrode overlying the semiconductor layer. The electrode is fed with power through the wiring metal.

22 Claims, 13 Drawing Sheets

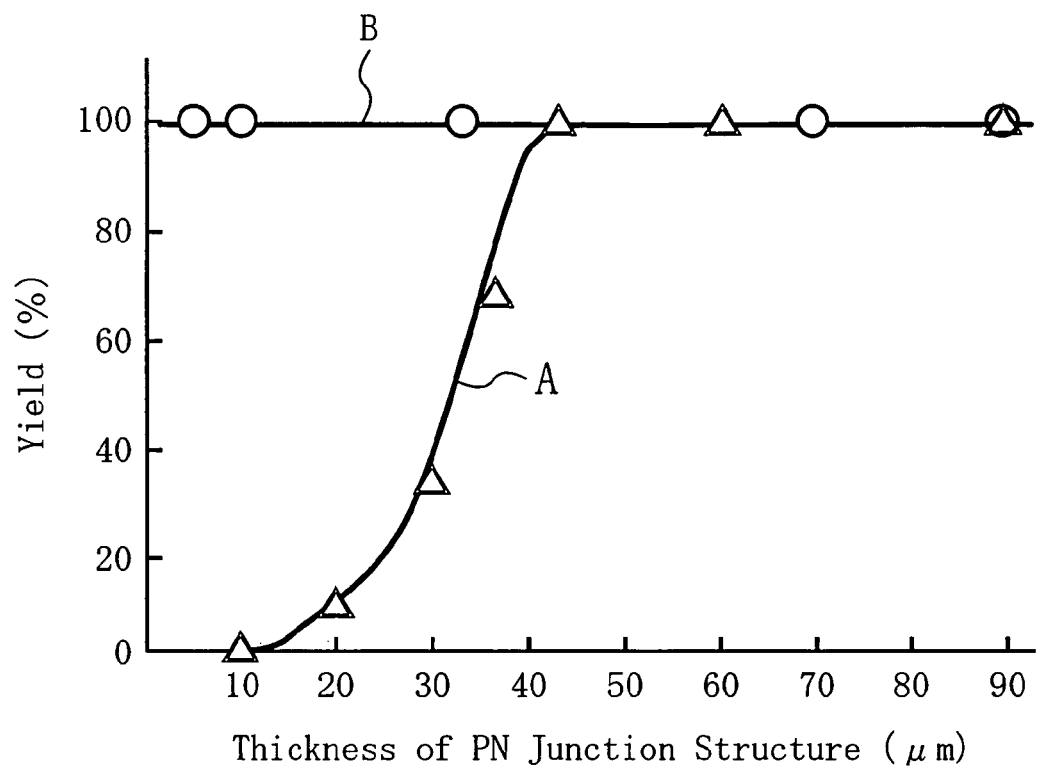

SEMICONDUCTOR LIGHT-EMITTING DEVICE, LIGHTING MODULE AND LIGHTING APPARATUS

CROSS-REFERENCE TO RELATED APPLICATIONS

The present application claims priority under 35 USC 119 (a) to Japanese Patent Application No. 2004-328182 filed on Nov. 11, 2004, the entire contents of which are hereby incorporated by reference.

BACKGROUND OF THE INVENTION (a) Field of the Invention

The present invention relates to a semiconductor light-emitting device having a light-emitting diode or the like, and particularly to a semiconductor light-emitting device used for lighting modules or lighting apparatuses, and a method for fabricating the same.

(b) Description of Related Art

Recently, as the luminance of a white light-emitting diode (hereinafter referred to as "LED") increases, the application of LEDs is greatly expanded from for indication to for illumination.

In general, the white LED has a structure in which a semiconductor light-emitting element for emitting blue or ultraviolet light in combined with a phosphor that is excited by the blue or ultraviolet light emitted from the semiconductor light-emitting element. The semiconductor light-emitting element includes a semiconductor layer comprising a p-type electrode and an n-type electrode, and the semiconductor layer has a pn junction structure formed by depositing a gallium nitride compound semiconductor layer on a sapphire substrate.

However, since the sapphire substrate has a electrical insulating property, there is a need to form an n-type electrode and a p-type electrode on a surface of the gallium nitride compound semiconductor layer that is opposite to the surface on which the sapphire substrate is formed. In semiconductor light-emitting devices employing such semiconductor light-emitting element, the following feeding method is generally used.

In a semiconductor light-emitting device using a first feeding method, a heat sink is bonded via Ag paste or the like to the surface of the sapphire substrate that is opposite to the surface on which the gallium nitride compound semiconductor layer is formed. The n-type and p-type electrodes, which are formed on the upper surface of the gallium nitride compound semiconductor layer of the semiconductor light-emitting element, are electrically connected to a feeding unit through a bonding wire. Therefore, in the semiconductor light-emitting device using the first feeding method, the n-type and p-type electrodes are fed through the bonding wire.

In a semiconductor light-emitting device using a second feeding method, a p-type electrode and an n-type electrode are formed at the upper level of the gallium nitride compound semiconductor layer deposited on the sapphire substrate. Moreover, patterned electrodes are formed on a heat sink and the patterned electrodes are flip-chip mounted using Au bumps through which the patterned electrodes are electrically connected to the p-type and n-type electrodes. Therefore, in the semiconductor light-emitting device using the second feeding method, the n-type and p-type electrodes are fed through the patterned electrodes formed on the heat sink.

The semiconductor light-emitting device using the first feeding method has the sapphire substrate interposed between the semiconductor light-emitting element and the heat sink. The sapphire substrate has large thermal resistance and thus poor heat dispersion. Therefore, the semiconductor light-emitting device using the first feeding method cannot achieve sufficient heat dispersion. As a result, when the semiconductor light-emitting device is applied to illumination or the like that requires a large mount of power, problems such as thermal saturation of light output and decrease of reliability of light output arise.

In addition, in the semiconductor light-emitting device using the second feeding method, only Au bumps serve as paths for heat dispersion and, therefore, sufficient heat dispersion cannot be achieved. As a result, also when the semiconductor light-emitting device is applied to illumination or the like that requires a large amount of power, problems such as thermal saturation of light output and decrease of reliability of light output arise.

To solve the problems, the following semiconductor light-emitting device has been proposed (see, e.g., D. Morita et al., "High Output Power 365 nm Ultraviolet Light Emitting Diode of GaN-Free Structure," Jpn. J. Appl. Phys. Vol. 41 (2002), pp. L1434-L1436).

FIG. 15 shows a cross sectional view of a known semiconductor light-emitting device.

As shown in FIG. 15, a p-side ohmic electrode 802, a pn junction structure 803, and an n-side ohmic electrode 804 are formed on a support 800, which is a heat sink and is made of CuW, with a fusion material 801 interposed between the support 800 and the p-side ohmic electrode 802. The pn junction structure 803 is a semiconductor layer which is formed by sequentially depositing a p-type gallium nitride compound semiconductor layer, an active layer, and an n-type gallium nitride compound semiconductor layer.

In this manner, over the support 800, a semiconductor light-emitting element is formed which includes the semiconductor layer (pn junction structure 803), the p-side ohmic electrode 802 underlying the semiconductor layer, and the n-side ohmic electrode 804 overlying the semiconductor layer.

On the n-side ohmic electrode 804, an Au plating layer 805 is formed which is electrically connected to a power supply pole 807 through an Au wire 806.

Now, how to complete the pn junction structure 803 will be described in detail.

First, a pn junction structure 803 on which a semiconductor layer is epitaxially grown is formed on a sapphire substrate (not shown). Then, the pn junction structure 803 formed on the sapphire substrate is peeled off therefrom using a laser lift-off technique, and the pn junction structure 803 is bonded via a fusion material 801 on a support 800. In this manner, the pn junction structure 803 formed on the sapphire substrate is peeled off therefrom by laser lift-off technique and then bonded on the support 800.

The conventional semiconductor light-emitting device allows the semiconductor light-emitting element to emit light by feeding a current to the power supply pole 807 and the conductive support 800 from outside.

In the conventional semiconductor light-emitting device, the semiconductor light-emitting element is formed via the fusion material 801 on the support 800 which is a heat sink, not on the sapphire substrate.

With this structure, the entire principal surface of the semiconductor light-emitting element is bonded via the fusion material 801 to the support 800 to achieve good heat dispersion in the semiconductor light-emitting device.

Moreover, in the conventional semiconductor light-emitting device, the semiconductor light-emitting element including the semiconductor layer (pn junction structure 803), the p-side ohmic electrode 802 underlying the semiconductor layer and the n-side ohmic electrode 804 overlying the semiconductor layer is formed over the support 800.

With this structure, the conventional semiconductor light-emitting device can reduce series resistance as compared with a semiconductor light-emitting device using a semiconductor light-emitting element which includes a semiconductor layer (pn junction structure) and p-side and n-side ohmic electrodes on the semiconductor layer. As a result, the conventional semiconductor light-emitting device can suppress heat generation therein.

However, the results of the inventors' experiments on the conventional semiconductor light-emitting device using laser lift-off technique have shown the following problems.

The pn junction structure 803 peeled off from the sapphire substrate (not shown) by laser lift-off technique is as extremely thin as several µm to over 10 µm. Therefore, during wire bonding, the semiconductor light-emitting element is deformed by application of ultrasound or local application of pressure from the tip part of a collet for wire bonding, and thereby causes cracking or chipping. As a result, there found a problem of significantly reducing yield of the semiconductor light-emitting device.

Moreover, the semiconductor light-emitting element is formed over the support 800 made of a material having a hardness lower than that of sapphire, SiC or the like. Therefore, during the wire bonding, the support 800 is easily deformed by loads placed through the application of ultrasound or local application of pressure from the tip part of the collet for wire bonding to the semiconductor light-emitting element, and thereby causes a deformation of the semiconductor light emitting element. As a result, there found a problem of generating cracking or chipping in the semiconductor light-emitting element.

Furthermore, in the case of a conventional semiconductor light-emitting device in which a plurality of semiconductor light-emitting elements are arranged in an array, power is supplied to each of the semiconductor light-emitting elements through bonding wires. Therefore, there found a problem that the larger the number of semiconductor light-emitting elements arranged in an array is, the significantly lower the yield of semiconductor light-emitting devices is.

Furthermore, the above conventional semiconductor light-emitting device requires a pad electrode on a light extraction surface of each of the semiconductor light-emitting elements. Therefore, the larger the number of the semiconductor light-emitting elements arranged in an array is, the significantly smaller the area of effective light extraction surface becomes. As a result, there found a problem that sufficient light emission efficiency cannot be obtained.

SUMMARY OF THE INVENTION

In consideration of the aforementioned problems, an object of the present invention is to provide, for a semiconductor light-emitting device having a semiconductor light-emitting element, a semiconductor light-emitting device which achieves increase in yield and has excellent light emission efficiency and a method for manufacturing the same, and a lighting module and a lighting apparatus which use the semiconductor light-emitting device.

To solve the problems, the feature of a semiconductor light-emitting device according to the first aspect of the present invention resides in including: a support; a semiconductor light-emitting element bonded to the support via a fusion material and comprising a first electrode and a second electrode, and a semiconductor layer having at least an active layer, at least one of the first and second electrodes overlying the semiconductor layer; and a wiring metal formed to extend from above a portion of the upper surface of the support not underlying the semiconductor light-emitting element to one said electrode overlying the semiconductor layer, wherein said one electrode is fed with power through the wiring metal.

In the semiconductor light-emitting device according to the first aspect of the present invention, the semiconductor light-emitting element is fed with power through the wiring metal, not a bonding wire. With this structure, the semiconductor light-emitting device can be fabricated without applying a pressure to the semiconductor light-emitting element. This makes it possible to prevent the fusion material, which is interposed between the support and the semiconductor light-emitting element, from being deformed to cause cracking or chipping in the semiconductor light-emitting element by giving pressure to the semiconductor light-emitting element during manufacturing. As a result, the yield of semiconductor light-emitting devices can be enhanced.

Moreover, in the semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

The feature of a semiconductor light-emitting device according to a second aspect of the present invention resides in including: a support made of a material having a low hardness; a semiconductor light-emitting element bonded to the support and comprising a first electrode, a second electrode, and a semiconductor layer having at least an active layer, at least one of the first and second electrodes overlying the semiconductor layer; and a wiring metal formed to extend from above a portion of the upper surface of the support not underlying the semiconductor light-emitting element to one said electrode overlying the semiconductor layer, wherein said one electrode is fed with power through the wiring metal.

In the semiconductor light-emitting device according to the second aspect of the present invention, the semiconductor light-emitting element is fed with power through the wiring metal, not a bonding wire. With this structure, the semiconductor light-emitting device can be fabricated without applying pressure to the semiconductor light-emitting element. Therefore, even when the support is made of a material having a hardness lower than sapphire, SiC or the like, it is possible to prevent the support made of the material having a low hardness being deformed to cause cracking or chipping in the semiconductor light-emitting element by giving pressure to the semiconductor light-emitting element in the manufacture. As a result, the yield of semiconductor light-emitting devices can be enhanced.

Moreover, in the semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

The feature of a semiconductor light-emitting device according to a third aspect of the present invention resides in including: a support; a semiconductor light-emitting element bonded to the support and comprising a semiconductor layer including at least an active layer, a first electrode on the lower surface of the semiconductor light-emitting element, and a second electrode on the upper surface thereof; and a wiring metal formed to extend from above a portion of the upper surface of the support not underlying the semiconductor light-emitting element to the second electrode, wherein the second electrode is fed with power through the wiring metal.

In the semiconductor light-emitting device according to the third aspect of the present invention, the semiconductor light-emitting element is fed with power through the wiring metal, not a bonding wire. With this structure, the semiconductor light-emitting device can be fabricated without applying pressure to the semiconductor light-emitting element. This makes it possible to prevent the electrode formed on the lower surface of the semiconductor layer from being deformed to cause cracking or chipping in the semiconductor light-emitting element by giving pressure to the semiconductor light-emitting element in the manufacture. As a result, the yield of semiconductor light-emitting devices can be enhanced.

Moreover, in the semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

In the semiconductor light-emitting device according to the first, second or third aspect of the present invention, the semiconductor layer preferably has a thickness of 30 μm or less.

In the conventional semiconductor light-emitting device, when the semiconductor layer has a thickness of 30 μm or less, a significant decrease of yield of semiconductor light-emitting devices is observed. On the other hand, in the semiconductor light-emitting device according to the first, second or third aspect of the present invention, even when the semiconductor layer has a thickness of 30 μm or less, the yield of semiconductor light-emitting devices does not decrease, and thus the yield of semiconductor light-emitting devices can be enhanced.

In the semiconductor light-emitting device according to the first, second or third aspect of the present invention, an insulating film is preferably formed between the wiring metal and the semiconductor light-emitting element.

This makes it possible to surely prevent current from leaking through a portion of the wiring metal formed on one side of the semiconductor light-emitting element. Therefore, current leakage can be reduced and thus the yield of semiconductor light-emitting devices can be further enhanced.

In the semiconductor light-emitting device according to the first, second or third aspect of the present invention, the insulating film preferably has a thickness of 100 nm or more.

With this structure, even when a pin hole is formed in the insulating film, current leakage through the pin hole can be prevented. In particular, in the case of the semiconductor light-emitting element including a semiconductor layer, a first electrode on the lower surface of the semiconductor element, and a second electrode on the upper surface thereof, it can be prevented that a short circuit is generated between the first and second electrodes to cause current leakage. Therefore, current leakage can be reduced and thus the yield of semiconductor light-emitting devices can be further enhanced.

In the semiconductor light-emitting device according to the first, second or third aspect of the present invention, the insulating film is preferably a film made of any one material selected from the group consisting of $SiO_2$, SiN, $TiO_2$, $Nd_2O_5$, $Ta_2O_5$ and $ZrO_2$ or a multilayer film made of a plurality of materials selected from the group.

In the semiconductor light-emitting device according to the first aspect of the present invention, the fusion material is preferably made of PbSn, AuSn, AgSn, or InSn.

In the semiconductor light-emitting device according to the first, second or third aspect of the present invention, the support is preferably made of Cu, Al, Au, CuW, SiC, Si, BN, AlN, or GaN.

With this structure, the semiconductor light-emitting element can be formed on the support which functions as a heat sink. Therefore, a semiconductor light-emitting device having excellent heat dispersion property can be provided and thus the semiconductor light-emitting device can operate with high power.

In the semiconductor light-emitting device according to the first, second or third aspect of the present invention, the angle between the portion of the upper surface of the support not underlying the semiconductor light-emitting element and the adjacent side surface of the semiconductor light-emitting element is preferably more than 90 degrees and less than 180 degrees.

With this structure, since the side surface of the semiconductor light-emitting element is tapered, the wiring metal can have excellent step coverage. Therefore, a portion of the wiring metal formed on the side surface of the semiconductor light-emitting element can be surely prevented from breaking. As a result, the yield of semiconductor light-emitting devices can be further enhanced.

In the semiconductor light-emitting device according to the first, second or third aspect of the present invention, the semiconductor layer preferably includes an n-type gallium nitride compound semiconductor layer in the upper side thereof and a p-type gallium nitride compound semiconductor layer in the lower side thereof.

With this structure, because of the n-type gallium nitride compound semiconductor layer having a smaller resistivity than the p-type gallium nitride compound semiconductor layer, current injected into the n-type gallium nitride compound semiconductor layer through the electrode is easily diffused into the semiconductor layer, as compared with the p-type gallium nitride compound semiconductor layer.

Thus, the electrode formed on the upper surface of the semiconductor layer can be downsized and the ratio of the area of the electrode to the upper surface of the semiconductor layer can be also reduced. As a result, the area of the effective light extraction surface of the semiconductor light-emitting element can be increased, which further enhances the light emission efficiency in the semiconductor light-emitting device.

In particular, in the semiconductor light-emitting element including the semiconductor layer, the first electrode on the lower surface of the semiconductor layer and the second electrode on the upper surface thereof, the electrode formed on the lower surface of the semiconductor layer is formed not as a partial electrode but as a full-scale electrode. Therefore, current can be injected uniformly into the p-type gallium nitride compound semiconductor layer and thus nonuniform light emission can be prevented. This not only increases the light emission efficiency but provides a semiconductor light-emitting device exhibiting uniform and good light emission.

In the semiconductor light-emitting device according to the first, second or third aspect of the present invention, one of the first and second electrodes formed on the upper surface of the semiconductor layer is preferably provided on the upper surface of the semiconductor layer at or near the center thereof.

With this structure, the density of current flowing from said one electrode to the semiconductor layer including at least the active layer becomes uniform in the surface of the active layer. As a result, light emission efficiency can be further enhanced in the semiconductor light-emitting device.

In the semiconductor light-emitting device according to the first, second or third aspect of the present invention, a resin material containing a phosphor excited by light emitted from the semiconductor light-emitting element is preferably formed on the surface of the semiconductor light-emitting element.

By mixing a color of light emitted from the semiconductor light-emitting element and a color of light emitted from the phosphor excited by the light emitted from the semiconductor light-emitting element, the semiconductor light-emitting device having white light emission can be achieved.

The feature of a semiconductor light-emitting device according to a fourth aspect of the present invention resides in including: a support; a plurality of semiconductor light-emitting elements each of which is bonded to the support via a fusion material and comprises a first electrode and a second electrode, and a semiconductor layer including at least an active layer, at least one of the first and second electrodes overlying the semiconductor layer; and a plurality of wiring metals formed to extend, for each of the plurality of semiconductor light-emitting elements, from above a portion of the upper surface of the support not underlying semiconductor light-emitting element to one said electrode overlying the semiconductor layer, wherein said one electrode is fed with power through the wiring metal.

In the semiconductor light-emitting device according to the fourth aspect of the present invention, each of the semiconductor light-emitting elements is fed with power through the common wiring metal, not a bonding wire. This makes it possible to prevent the fusion material, which is interposed between the support and the semiconductor light-emitting element, from being deformed to cause cracking or chipping in the semiconductor light-emitting elements by giving pressure to the semiconductor light-emitting elements during manufacturing. As a result, regardless of the number of semiconductor light-emitting elements arranged in an array, the yield of semiconductor light-emitting devices can be enhanced.

Moreover, since each of the semiconductor light-emitting elements is fed with power through the common wiring metal, there is no need to bond the wire to each of the semiconductor light-emitting elements. As a result, regardless of the number of semiconductor light-emitting elements arranged in an array, the yield of semiconductor light-emitting devices can be enhanced and the manufacturing cost can be reduced.

Moreover, there is no need to form a pad electrode on the surface of each semiconductor light-emitting element. This increases the area of the effective light extraction surface of the semiconductor light-emitting element, thereby enhancing the light emission efficiency.

Furthermore, the arrangement of the plurality of semiconductor light-emitting elements in an array increases, the ratio of the area of the side surfaces of all the semiconductor light-emitting elements to the light extraction surfaces of all the semiconductor light-emitting elements. As a result, light emission efficiency can be further enhanced.

The feature of a semiconductor light-emitting device according to a fifth aspect of the present invention resides in including: a support made of a material having a low hardness; a plurality of semiconductor light-emitting elements each of which is bonded to the support, comprises a first electrode, a second electrode, and a semiconductor layer including at least an active layer, at least one of the first and second electrodes overlying the semiconductor layer; and a plurality of wiring metals formed to extend, for each of the plurality of semiconductor light-emitting elements, from above a portion of the upper surface of the support not underlying semiconductor light-emitting element to one said electrode overlying the semiconductor layer, wherein said one electrode is fed with power through the wiring metal.

In the semiconductor light-emitting device according to the fifth aspect of the present invention, each of the semiconductor light-emitting elements is fed with power through the common wiring metal, not a bonding wire. With this structure, even when the support is made of a material having a hardness lower than sapphire, SiC or the like, it is possible to prevent the support made of a material having a low hardness from being deformed to cause cracking or chipping in the semiconductor light-emitting elements by giving pressure to the semiconductor light-emitting elements during manufacturing. As a result, regardless of the number of semiconductor light-emitting elements arranged in an array, the yield of semiconductor light-emitting devices can be enhanced.

Moreover, since each of the semiconductor light-emitting elements is fed with power through the common wiring metal, there is no need to bond the wire to each of the semiconductor light-emitting elements. As a result, regardless of the number of semiconductor light-emitting elements arranged in an array, the yield of semiconductor light-emitting devices can be enhanced and the manufacturing cost can be reduced.

Moreover, there is no need to form a pad electrode on the surface of each semiconductor light-emitting element. This increases the area of the effective light extraction surface of the semiconductor light-emitting element, thereby enhancing the light emission efficiency.

Furthermore, the arrangement of the plurality of semiconductor light-emitting elements in an array increases the ratio of the area of the side surfaces of all the semiconductor light-emitting elements to the light extraction surfaces of all the semiconductor light-emitting elements. As a result light emission efficiency can be further enhanced.

The feature of a semiconductor light-emitting device according to a sixth aspect of the present invention resides in including: a support; a plurality of semiconductor light-emitting elements each of which is bonded to the support and comprises a semiconductor layer including at least an active layer, a first electrode on the lower surface of the semiconductor light-emitting device and a second electrode on the upper surface thereof; and a plurality of wiring metals formed to extend, for each of the plurality of semiconductor light-emitting elements, from above a portion of the upper surface of the support not underlying semiconductor light-emitting element to the second electrode, wherein the second electrode is fed with power through the wiring metal.

In the semiconductor light-emitting device according to the sixth aspect of the present invention, each of the semiconductor light-emitting elements is fed with power through the common wiring metal, not a bonding wire. This makes it possible to prevent the electrode formed on the lower surface of the semiconductor layer from being deformed to cause cracking or chipping in the semiconductor light-emitting element by giving pressure to the semiconductor light-emitting element during wire bonding. As a result, regardless of the number of semiconductor light-emitting elements arranged in an array, the yield of semiconductor light-emitting devices can be enhanced.

Moreover, since each of the semiconductor light-emitting elements is fed with power through the common wiring metal, there is no need to bond the wire to each of the semiconductor light-emitting elements. As a result, regardless of the number of semiconductor light-emitting elements arranged in an array, the yield of semiconductor light-emitting devices can be enhanced and the manufacturing cost can be reduced.

Moreover, there is no need to form a pad electrode on the surface of each semiconductor light-emitting element. This increases the area of the effective light extraction surface of the semiconductor light-emitting element, thereby further enhancing the light emission efficiency.

Furthermore, the arrangement of the plurality of semiconductor light-emitting elements in an array increases the ratio of the area of the side surfaces of all the semiconductor light-emitting elements to the light extraction surfaces of all the semiconductor light-emitting elements. As a result light emission efficiency can be further enhanced.

The feature of a lighting module according to an aspect of the present invention resides in including the semiconductor light-emitting device of the present invention.

In the lighting module according to the aspect of the present invention, each of the semiconductor light-emitting elements constituting part of the lighting module is fed with power through the common wiring metal, not a bonding wire. This makes it possible to prevent cracking or chipping from occurring in the semiconductor light-emitting element by giving pressure to the semiconductor light-emitting element during wire bonding. As a result, the yield of semiconductor light-emitting devices constituting part of the lighting module can be enhanced and the lighting module can be fabricated with a high yield.

In particular, when the semiconductor light-emitting elements constituting part of the lighting module are bonded to the support which is the heat sink, this not only increases the yield but provides a semiconductor light-emitting device having excellent heat dispersion property. Since the lighting module having excellent heat dispersion can be provided, the lighting module can operate with high power.

The feature of a lighting apparatus according to an aspect of the present invention resides in including the lighting module of the present invention.

In the lighting apparatus according to the aspect of the present invention, each of the semiconductor light-emitting elements constituting part of the lighting apparatus is fed with power through the common wiring metal, not a bonding wire. This makes it possible to prevent cracking or chipping from occurring in the semiconductor light-emitting element by giving pressure to the semiconductor light-emitting element during wire bonding. As a result, the yield of semiconductor light-emitting devices constituting part of the lighting apparatus can be enhanced and the lighting apparatus can be fabricated with a high yield.

In particular, when the semiconductor light-emitting elements constituting part of the lighting apparatus are bonded to the support which is the heat sink, this not only increases the yield but provides a semiconductor light-emitting device having excellent heat dispersion property. Since the lighting apparatus having excellent heat dispersion can be provided, the lighting apparatus can operate with high power.

The feature of a method for fabricating the semiconductor light-emitting device according to the first aspect of the present invention resides in comprising the steps of: forming, on a substrate, a semiconductor layer including at least an active layer; forming a first electrode on the semiconductor layer; forming a support via a fusion material on a surface of the first electrode opposite to a surface thereof on which the semiconductor layer is formed; peeling off the semiconductor layer from the substrate after the step of forming the support; forming a semiconductor light-emitting element with the semiconductor layer; forming a second electrode on a surface of the semiconductor light-emitting element opposite to the surface thereof on which the first electrode is formed; and forming a wiring metal to extend to the second electrode from above a portion of the surface of the support not underlying the semiconductor light-emitting element, the surface of the support being the surface on which the first electrode is formed via the fusion material.

In the method for fabricating the semiconductor light-emitting device according to the first aspect of the present invention, the semiconductor light-emitting element is fed with power through the wiring metal, not a bonding wire. Thus, the semiconductor light-emitting device can be fabricated without applying pressure to the semiconductor light-emitting element. Therefore, it is possible to prevent the fusion material, which is interposed between the support and the semiconductor light-emitting element, from being deformed to cause cracking or chipping in the semiconductor light-emitting element by giving pressure to the semiconductor light-emitting element during manufacturing. As a result, the yield of semiconductor light-emitting devices can be enhanced.

Moreover, in fabricating a semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

The feature of a method for fabricating the semiconductor light-emitting device according to the second aspect of the present invention resides in comprising the steps of: forming, on a substrate, a semiconductor layer including at least an active layer; forming a first electrode on the semiconductor layer; forming a support, which is made of a material having a low hardness, on a surface of the first electrode opposite to the surface thereof on which the semiconductor layer is formed; peeling off the semiconductor layer from the substrate after the step of forming the support; forming a semiconductor light-emitting element with the semiconductor layer; forming a second electrode on a surface of the semiconductor light-emitting element opposite to a surface thereof on which the first electrode is formed; and forming a wiring metal to extend to the second electrode from above a portion of the surface of the support not underlying the semiconductor light-emitting element, the surface of the support being the surface on which the first electrode is formed.

In the method for fabricating the semiconductor light-emitting device according to the second aspect of the present invention, the semiconductor light-emitting element is fed with power through the wiring metal, not a bonding wire. Thus, the semiconductor light-emitting device can be fabricated without applying pressure to the semiconductor light-emitting element. Therefore, even when the support is made of a material having a hardness lower than sapphire, SiC or the like, it is possible to prevent the support made of a material having a low hardness from being deformed to cause cracking or chipping in the semiconductor light-emitting element by giving pressure to the semiconductor light-emitting element during manufacturing. As a result, the yield of semiconductor light-emitting devices can be enhanced.

Moreover, in fabricating a semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

The feature of a method for fabricating the semiconductor light-emitting device according to the third aspect of the present invention resides in comprising the steps of: forming, on a substrate, a semiconductor layer including at least an active layer; forming a first electrode on the semiconductor layer; forming a support on a surface of the first, electrode opposite to a surface thereof on which the semiconductor layer is formed; peeling off the semiconductor layer from the substrate after the step of forming the support; forming a semiconductor light-emitting element with the semiconductor layer; forming a second electrode on a surface of the semiconductor light-emitting element opposite to a surface thereof on which the first electrode is formed; and forming a wiring metal to extend to the second electrode from above a portion of the surface of the support not underlying the semiconductor light-emitting element, the surface of the support being the surface on which the first electrode is formed.

In the method for fabricating the semiconductor light-emitting device according to the third aspect of the present invention, the semiconductor light-emitting element is fed with power through the wiring metal, not a bonding wire. Thus, the semiconductor light-emitting device can be fabricated without applying pressure to the semiconductor light-emitting element. Therefore, it is possible to prevent the electrode formed on the lower surface of the semiconductor layer from being deformed to cause cracking or chipping in the semiconductor light-emitting element by giving pressure to the semiconductor light-emitting element during manufacturing. As a result, the yield of semiconductor light-emitting devices can be enhanced.

Moreover, in fabricating a semiconductor light-emitting device of the present invention, there is no need to form a pad electrode on a light extraction surface of the semiconductor light-emitting element. This increases the area of the effective light extraction surface of the semiconductor light-emitting element, thereby enhancing the light emission efficiency.

The methods for fabricating the semiconductor light-emitting device according to the first, second or third aspect of the present invention preferably further include the step of forming an insulating film on a side surface of the semiconductor light-emitting element after the step of forming the semiconductor light-emitting element and before the step of forming the second electrode, or after the step of forming the second electrode and before the step of forming the wiring metal.

This makes it possible to surely prevent current from leaking through a portion of the wiring metal formed on one side of the semiconductor light-emitting element. Therefore, current leakage can be reduced and thus the yield of semiconductor light-emitting devices can be further enhanced.

In the methods for fabricating the semiconductor light-emitting device according to the first, second or third aspect of the present invention, laser light having a wavelength no more than that at the absorption edge of the semiconductor layer is selected, and the semiconductor layer is preferably peeled off from the substrate by irradiating a surface of the substrate opposite to the surface thereof on which the semiconductor layer is formed with the laser light.

Thus, the semiconductor layer can be irradiated with laser light having a wavelength corresponding to the wavelength at the absorption edge of the semiconductor layer. Therefore, the semiconductor layer absorbs the energy of the laser light to decompose, which allows the semiconductor layer to be peeled off from the substrate.

In the methods for fabricating the semiconductor light-emitting device according to the first, second or third aspect of the present invention, the substrate is preferably a transparent substrate.

In the methods for fabricating the semiconductor light-emitting device according to the first, second or third aspect of the present invention, the transparent substrate is preferably made of sapphire.

In the methods for fabricating the semiconductor light-emitting device according to the first, second or third aspect of the present invention, a contact layer forming the semiconductor layer is preferably made of $In_xAl_yGa_{1-x-y}N$ ($0\leq x\leq 1$, $0\leq y\leq 1$, $0\leq x+y\leq 1$).

In the methods for fabricating the semiconductor light-emitting device according to the first, second or third aspect of the present invention, the laser light is preferably laser light emitted from any one of device selected from the group of consisting of a YAG third harmonic laser, a KrF excimer laser, and an ArF excimer laser.

As mentioned above, in the semiconductor light-emitting device according to the present invention, the semiconductor light-emitting element is fed with power through the wiring metal, not a bonding wire. With this structure, the semiconductor light-emitting device can be fabricated without applying pressure to the semiconductor light-emitting element. This makes it possible to prevent cracking or chipping from occurring in the semiconductor light-emitting element by giving pressure to the semiconductor light-emitting element during manufacturing. As a result, the yield of semiconductor light-emitting devices can be enhanced.

In particular, in the case of the semiconductor light-emitting device in which the plurality of semiconductor light-emitting elements are arranged in an array, each of the semiconductor light-emitting elements is fed with power through not the bonding wire but the common wiring metal. Therefore, the yield of semiconductor light-emitting devices can be further enhanced.

Moreover, since there is no need to form a pad electrode on a light extraction surface of the semiconductor light-emitting element, the area of the effective light extraction surface of the semiconductor light-emitting element can be increased and, therefore, the light emission efficiency can be enhanced.

BRIEF DESCRIPTION OF THE DRAWINGS

FIG. 3 is a diagram showing changes of yield of semiconductor light-emitting devices with the thickness of the pn junction structure;

DETAILED DESCRIPTION OF THE INVENTION

Figure 1A:
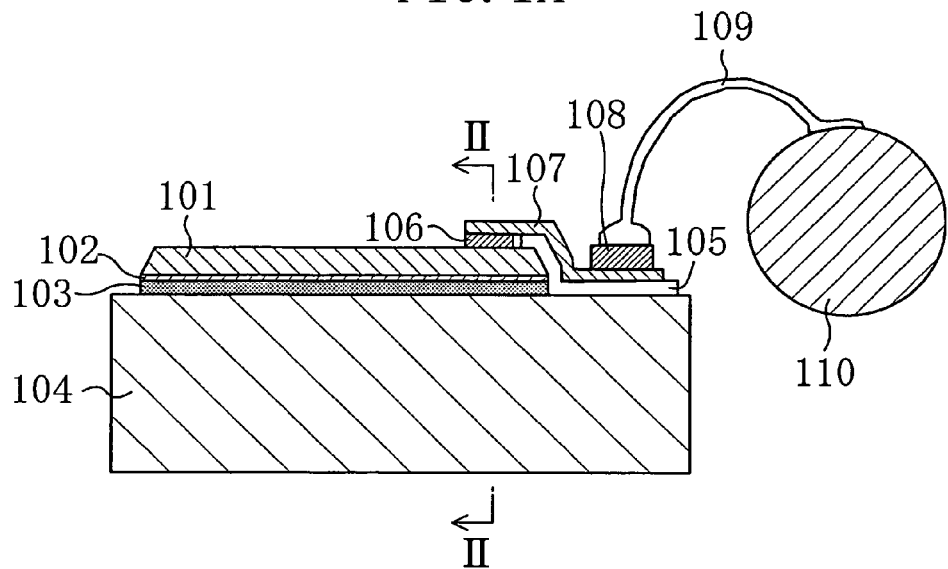
FIGS. 1A and 1B are diagrams showing the structure of a semiconductor light-emitting device according to a first embodiment of the present invention.

Now, referring to the drawings, embodiments of the present invention will be described.

First Embodiment

First, referring to FIGS. 1A and 1B, the structure of a semiconductor light-emitting device according to a first embodiment of the present invention will be described.

Figure 1B:
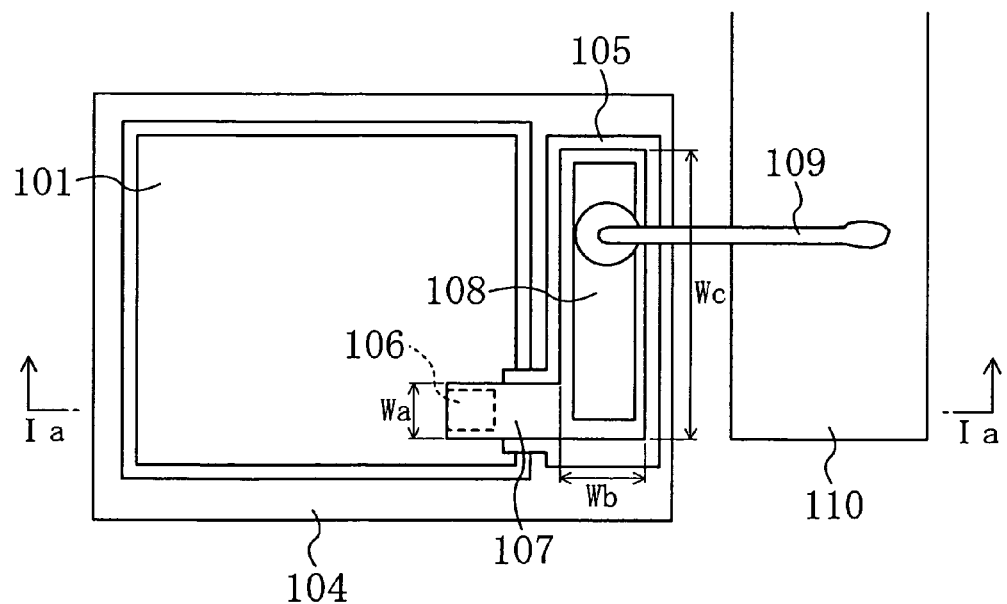

FIGS. 1A and 1B are diagrams showing the structure of the semiconductor light-emitting device according to the first embodiment of the present invention. Note that FIG. 1A is a cross sectional view showing the structure of the semiconductor light-emitting device according to the first embodiment of the present invention, specifically, a cross sectional view taken along line Ia-Ia of FIG. 1B and FIG. 1B is a plan view showing the same.

As illustrated in FIG. 1A, a p-side ohmic electrode 102, a pn junction structure 101, and an n-side ohmic electrode 106 are sequentially formed on a support 104 made of CuW with a fusion material 103 interposed between the support 104 and the p-side ohmic electrode 102. The pn junction structure 101 has a thickness of 5 µm and a 350 µm square shape, and comprises a semiconductor layer formed by sequentially laminating a p-type gallium nitride compound semiconductor layer, an active layer and an n-type gallium nitride compound semiconductor layer. Thus, a semiconductor light-emitting element is formed which includes the semiconductor layer (pn junction structure 101) and the adjoining p-side and n-side ohmic electrodes 102 and 106.

A wiring metal 107 is formed to extend from the upper surface of the n-side ohmic electrode 106 on top of the pn junction structure 101 to above a portion of the upper surface of the support 104 not underlying the semiconductor light-emitting element with an insulating film 105 made of a $SiO_2$ film interposed therebetween. In this manner, the insulating film 105 is formed between the support 104 and the wiring metal 107 and between the semiconductor light-emitting element and the wiring metal 107. The wiring metal 107 is a metal film formed by sequentially depositing a Ti layer of 50 nm, a Pt layer of 100 nm, and an Au layer of 300 nm. The wiring metal 107 electrically connects between the n-side ohmic electrode 106 and the below-mentioned Au plating layer 108.

The Au plating layer 108 having a thickness of 30 µm is formed on a portion of the wiring metal 107 formed straight above the upper surface of the support 104 with the insulating film 105 interposed therebetween. The Au plating layer 108 is electrically connected to a power supply pole 110 through an Au wire 109.

As illustrated in FIG. 1B, the p-side ohmic electrode (not shown) and the pn junction structure 101 are sequentially formed on the support 104, and the n-side ohmic electrode 106 is formed in the periphery of the upper surface of the pn junction structure 101. In this manner, on the support 104, the semiconductor light-emitting element is formed in which the p-side ohmic electrode (not shown) is formed on the lower surface of the pn junction structure 101 while the n-side ohmic electrode 106 is formed on the upper surface thereof.

The width Wa of the wiring metal 107 illustrated in FIG. 1B is about 50 µm. The wiring metal 107 is formed from the upper surface of the n-side ohmic electrode 106 to above the portion of the upper surface of the support 104 that does not underlie the semiconductor light-emitting element and is overlain by the insulating film 105.

The portion of the wiring metal 107 formed on the upper surface of the support 104 with the insulating film 105 interposed therebetween is patterned into a rectangle having a width Wb of 100 µm and a width Wc of 300 µm to form an electrode pad. The Au plating layer 108 having a thickness of 30 µm is formed on the electrode pad and electrically connected to the power supply pole 110 through the Au wire 109.

The semiconductor light-emitting device according to the first embodiment of the present invention allows the semiconductor light-emitting element to emit light by supplying current from the outside to the conductive support 104 made of CuW and the power supply pole 110.

Next, referring to FIG. 2, details of the pn junction structure forming the semiconductor light-emitting device according to the first embodiment of the present invention will be described.

Figure 2:
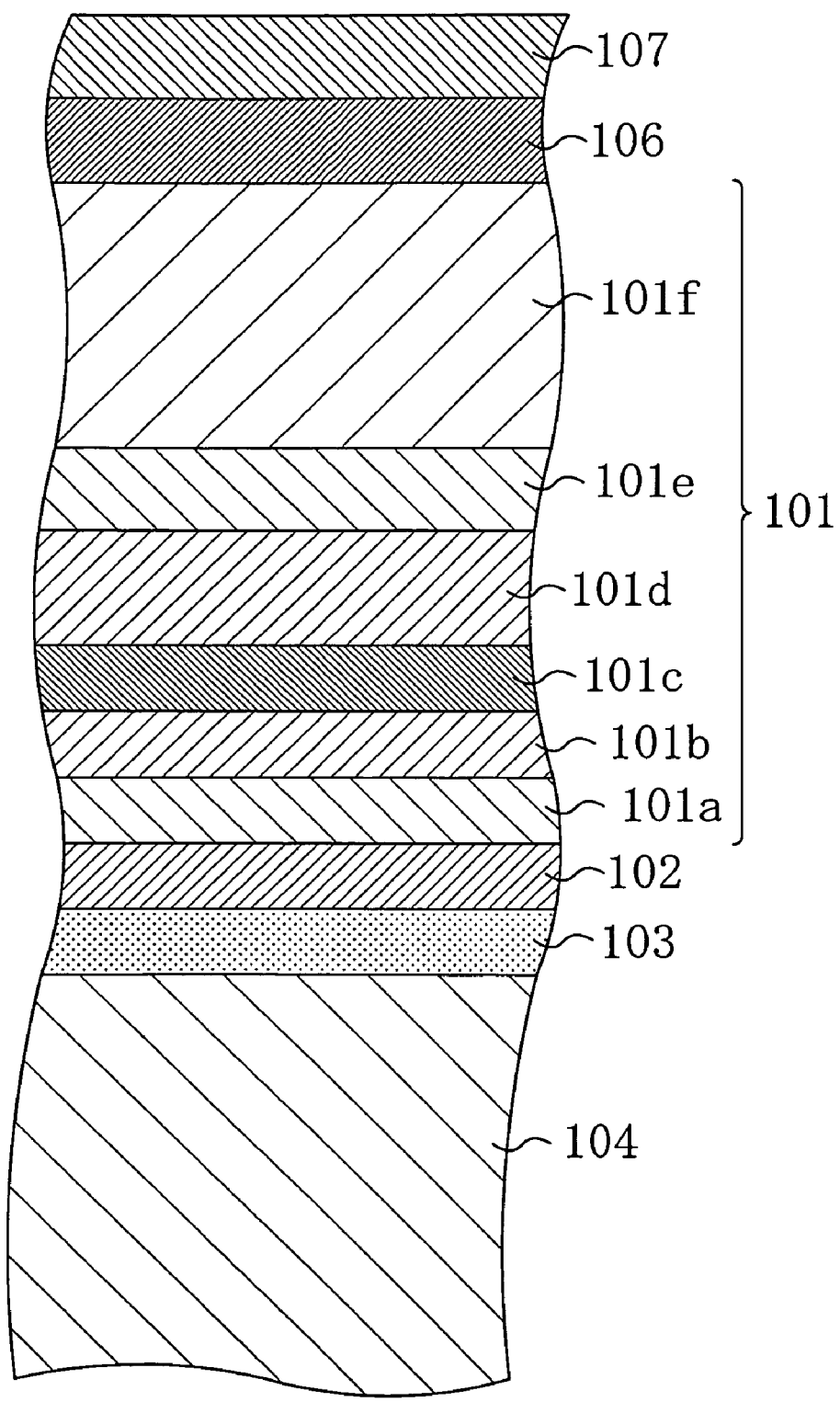
FIG. 2 is a cross sectional view showing details of a pn junction structure constituting part of the semiconductor light-emitting device according to the first embodiment of the present invention.

FIG. 2 is a diagram showing details of the pn junction structure forming the semiconductor light-emitting device according to the first embodiment of the present invention and, specifically, is a cross sectional view taken along line II-II of FIG. 1A.

As illustrated in FIG. 2, six layers are deposited on the p-side ohmic electrode 102 in the following order: a 5 nm thick p-GaN contact layer 101a; a 10 nm thick p-$Al_{0.15}Ga_{0.85}N$ current diffusion layer 101b; a 10 nm thick p-$Al_{0.30}Ga_{0.70}N$ barrier layer 101; a 30 nm thick $Al_{0.15}Ga_{0.85}N$ intermediate layer 101d; a multiple quantum well active layer 101e formed by depositing a 10 nm thick n-$Al_{0.15}Ga_{0.85}N$ barrier layer and a 1.5 nm thick n-$Al_{0.04}Ga_{0.95}In_{0.01}N$ quantum well active layer for five cycles; and a 4 µm thick n-GaN contact layer 101f. On the n-GaN contact layer 101f, the n-side ohmic electrode 106 is formed.

In this manner, the pn junction structure 101 is formed in which the p-type gallium nitride compound semiconductor layer, the active layer, and the n-type gallium nitride compound semiconductor layer are sequentially deposited. In addition, the p-side ohmic electrode 102 is formed on the lower surface of the pn junction structure 101 while the n-side ohmic electrode 106 is formed on the upper surface of the pn junction structure 101. The semiconductor light-emitting element including the semiconductor layer (pn junction structure 101) and the adjoining p-side and n-side ohmic electrodes 102 and 106 is formed on the support 104 via the fusion material 103.

Next, referring to FIG. 3, the yield of semiconductor light-emitting devices according to the first embodiment of the present invention will be described.

FIG. 3 is a diagram showing changes of yield of semiconductor light-emitting devices with the thickness of the pn junction structure.

A curve A of FIG. 3 shows changes of yield of semiconductor light-emitting devices when power is fed to the n-side ohmic electrode 804 through the bonding wire as in the known technique, and a straight line B of FIG. 3 shows changes of yield of semiconductor light-emitting devices when power is fed to the n-side ohmic electrode 106 through the wiring metal 107 as in the first embodiment of the present invention.

As shown in the curve A, according to the feeding method for the known semiconductor light-emitting device, the yield of semiconductor light-emitting devices is rapidly reduced with decrease in the thickness of the pn junction structure. In particular, when the thickness of the pn junction structure is decreased to 30 μm or less, the yield of semiconductor light-emitting devices is significantly reduced.

Thus, in the known semiconductor light-emitting device, when the pn junction structure 803 is thin, cracking or chipping occurs in the semiconductor light-emitting element by application of ultrasound or local application of pressure from the tip part of a collet for wire bonding during wire bonding to the n-side ohmic electrode 804. Thus, the conventional semiconductor light-emitting device causes failures such as an electrical short circuit, an increase in current leakage, an increase in nonuniform light emission in the vicinity of the p-side ohmic electrode and a decrease of light output. Therefore, according to the feeding method for the known semiconductor light-emitting device, the yield of semiconductor light-emitting devices is rapidly reduced with decrease in the thickness of the semiconductor light-emitting element.

On the other hand, as shown in the straight line B, according to a feeding method for a semiconductor light-emitting device according to the first embodiment of the present invention, the yield is constant (100%) regardless of the thickness of the pn junction structure, thereby realizing an extremely high yield of semiconductor light-emitting devices.

Since, in the semiconductor light-emitting device according to the first embodiment of the present invention, power is fed to the n-side ohmic electrode 106 through the wiring metal 107, not the bonding wire, cracking or chipping does not occur in the semiconductor light-emitting element in the wire bonding unlike the known technique. Therefore, in the case of the semiconductor light-emitting device according to the first embodiment of the present invention, as shown in the straight line B, any decrease of the yield is not observed, and even when the semiconductor light-emitting element has a thickness of 1.5 μm, good light emission can be realized.

As mentioned above, in the semiconductor light-emitting device according to the first embodiment of the present invention, the wire is bonded to not the semiconductor light-emitting element but a portion of the support 104 not underlying the semiconductor light-emitting element. Therefore, the semiconductor light-emitting element is fed with power through the wiring metal 107, not a bonding wire. With this structure, the semiconductor light-emitting device can be fabricated without applying pressure to the semiconductor light-emitting element. Therefore, it is possible to prevent the fusion material 103 (e.g., AuSn), which is interposed between the support 104 and the semiconductor light-emitting element, from being deformed to cause cracking or chipping in the semiconductor light-emitting element by giving pressure to the semiconductor light-emitting element during wire bonding. As a result, the yield of semiconductor light-emitting devices can be enhanced.

In addition, the pad electrode can be formed not above the semiconductor light-emitting element but above a portion of the support 104 not underlying the semiconductor light-emitting element. Therefore, there is no need to form a pad electrode on a light extraction surface of the semiconductor light-emitting element. This increases the area of the effective light extraction surface of the semiconductor light-emitting element, thereby enhancing the light emission efficiency.

In the case of the semiconductor light-emitting device according to the first embodiment of the present invention, as shown in FIG. 3, the yield is constant (100%) regardless of the thickness of the pn junction structure. On the other hand, in the case of the known semiconductor light-emitting device, as also shown in FIG. 3, the yield is rapidly reduced with decrease in the thickness of the pn junction structure. In particular, when the thickness of the pn junction structure is decreased to 30 μm or less, the yield is significantly reduced.

As mentioned above, in the case of the semiconductor light-emitting device according to the first embodiment of the present invention, even when the thickness of the pn junction structure is decreased to 30 μm or less, the yield of semiconductor light-emitting devices does not decrease. In other words, the semiconductor light-emitting devices can be fabricated with extremely high yield.

In the semiconductor light-emitting device according to the first embodiment of the present invention, as shown in FIG. 1A, the insulating film 105 having a thickness of 300 nm and made of a $SiO_2$ film is formed between the wiring metal 107 and the semiconductor light-emitting element.

This surely prevents that current injected from the p-side ohmic electrode 102 to the p-type gallium nitride compound semiconductor layers flows into the n-type gallium nitride compound semiconductor layer through a portion of the wiring metal 107 formed on one side of the semiconductor light-emitting element to cause current leakage. Therefore, the yield of semiconductor light-emitting devices can be further enhanced.

Moreover, if, as in the first embodiment, the insulating film 105 having a thickness of 100 nm or more is formed, this surely prevents that even when a pin hole is formed in the insulating film, current injected from the p-side ohmic electrode 102 to the p-type gallium nitride compound semiconductor layers flows into the n-type gallium nitride compound semiconductor layer through the pin hole to cause current leakage. Therefore, the yield of semiconductor light-emitting devices can be further enhanced.

Furthermore, as in the first embodiment, in the case where the support 104 is made of a conductive material (e.g., CuW), the insulating film 105 is formed between the wiring metal 107 and the support 104. With this structure, the portion of the wiring metal 107 formed above the upper surface of the support 104 is prevented from leaking current to the support 104. Therefore, the yield of semiconductor light-emitting devices can be further enhanced.

Moreover, in the case where the support 104 is made of a material having high resistivity, current leakage through the portion of the wiring metal formed on the upper surface of the support can be effectively prevented. However, when, as in the first embodiment, the insulating film 105 is formed between the wiring metal 107 and the support 104, current leakage can be more surely prevented.

In the semiconductor light-emitting device according to the first embodiment of the present invention, as illustrated in FIGS. 1A and 1B, the semiconductor light-emitting element is bonded to the support 104 made of CuW via the fusion material 103.

With this structure, the semiconductor light-emitting element can be formed on the support 104 which functions as a heat sink. Therefore, a semiconductor light-emitting device having excellent heat dispersion property can be provided and thus the semiconductor light-emitting device can operate with high power.

In the semiconductor light-emitting device according to the first embodiment of the present invention, as illustrated in FIG. 1A, the angle between the portion of the upper surface of the support 104 not underlying the semiconductor light-emitting element and the adjacent side surface of the semiconductor light-emitting element is more than 90 degrees and less than 180 degrees.

With this structure, since the side surface of the semiconductor light-emitting element is tapered, the wiring metal 107 can have excellent step coverage. Therefore, a portion of the wiring metal 107 formed on the side surface of the semiconductor light-emitting element can be surely prevented from breaking. As a result, the yield of semiconductor light-emitting devices can be further enhanced.

In the semiconductor light-emitting device according to the first embodiment of the present invention, as illustrated in FIG. 2, the pn junction structure 101 includes the n-type gallium nitride compound semiconductor layer 101f in the upper side and the p-type gallium nitride compound semiconductor layers 101a to 101c in the lower side.

With this structure, in the pn junction structure 101 formed by depositing the plurality of semiconductor layers, not the p-GaN contact layer 101a but the n-GaN contact layer 101f can be placed as the uppermost layer. Since the n-GaN contact layer 101f has a smaller resistivity than the p-GaN contact layer 101a, current injected into the n-type gallium nitride compound semiconductor layer through the n-side ohmic electrode 106 is easily diffused into the semiconductor layer (pn junction structure 101) as compared with the p-type gallium nitride compound semiconductor layer.

Thus, the n-side ohmic electrode 106 can be downsized and the ratio of the area of the n-side ohmic electrode 106 to the upper surface of the pn junction structure 101 can be reduced. Therefore, the area of the effective light extraction surface of the semiconductor light-emitting element can be increased, which further enhances the light emission efficiency in the semiconductor light-emitting device.

Moreover, since the p-side ohmic electrode 102 is formed on the lower surface of the pn junction structure 101, it can be formed not as a partial electrode but as a full-scale electrode. Therefore, current can be injected uniformly into the p-type gallium nitride compound semiconductor layer and thus nonuniform light emission can be prevented. This not only increases the light emission efficiency but provides a semiconductor light-emitting device exhibiting uniform and good light emission.

Now, referring to FIGS. 4A to 4D and 5A to 5E, a method for fabricating the semiconductor light-emitting device according to the first embodiment of the present invention will be described.

FIGS. 4A to 4D and 5A to 5E are cross sectional views of essential parts showing the steps of fabricating the semiconductor light-emitting device according to the first embodiment of the present invention.

Figure 4A:
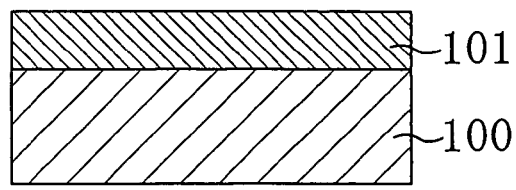
FIGS. 4A through 4D are cross sectional views of essential parts showing the first half of the steps of fabricating the semiconductor light-emitting device according to the first embodiment of the present invention.

As illustrated in FIG. 4A, a pn junction structure 101 is formed on a sapphire substrate 100. The pn junction structure 101 is a semiconductor layer formed by sequentially depositing an n-type gallium nitride compound semiconductor layer, an active layer, a p-type gallium nitride compound semiconductor layer through epitaxial growth.

Figure 4B:
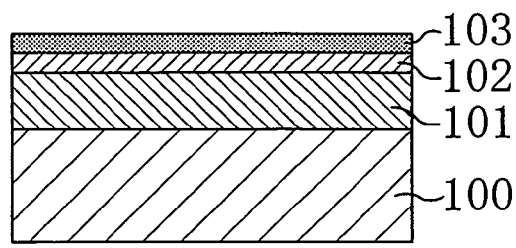

Next, as illustrated in FIG. 4B, a p-side ohmic electrode 102 and a fusion material 103 made of AuSn are sequentially formed on the pn junction structure 101.

Figure 4C:
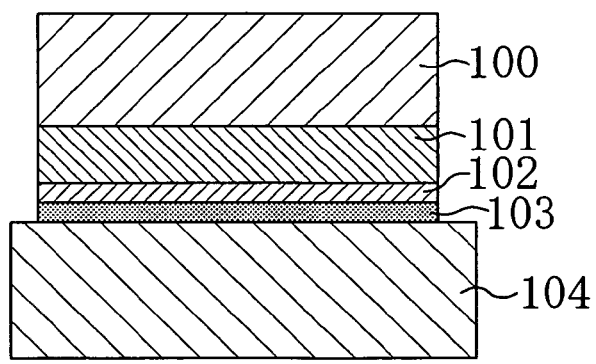

Next, as illustrated in FIG. 4C, a support 104 made of CuW is pressed against, with the fusion material 103 interposed therebetween, the surface of the p-side ohmic electrode 102 opposite to the surface on which the pn junction structure 101 is formed. Subsequently, the resultant structure is held at 380° C. for one minute with the support 104 pressed against the p-side ohmic electrode 102 and then is returned to room temperatures, thereby bonding the pn junction structure 101 to the support 104 via the fusion material 103.

Figure 4D:
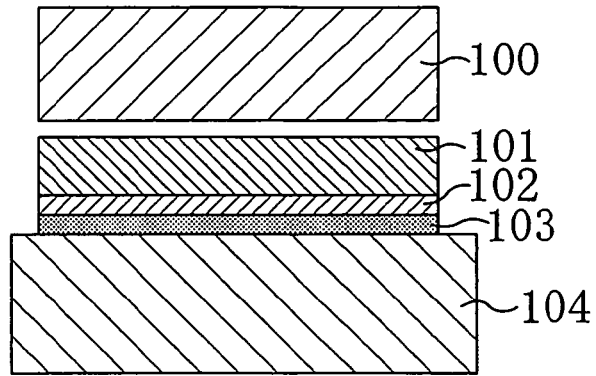

Next, as illustrated in FIG. 4D, the surface of the substrate 100 opposite to the surface thereof on which the pn junction structure 101 is formed is irradiated with pulsed YAG third harmonic laser (with a wavelength of about 355 nm) to scan the entire surface, thereby peeling off the pn junction structure 101 from the substrate 100.

As described above in FIG. 2, the semiconductor layer constituting part of the pn junction structure 101 formed on the support 104 includes an n-GaN contact layer 101f as the uppermost layer. The wavelength at the absorption edge of the n-GaN contact layer is about 365 nm. Therefore, in the step illustrated in FIG. 4D, the substrate 100 is irradiated with pulsed YAG third harmonic laser whose wavelength is about 355 nm. Thus, the n-GaN contact layer is decomposed by absorbing energy of the pulsed YAG third harmonic laser.

Since the laser lift-off technique is employed in the above manner, the n-GaN contact layer is decomposed at a location about 0.2 μm away from the interface between the pn junction structure 101 and the substrate 100, thereby peeling off the pn junction structure 101 from the substrate 100. Gallium is deposited on the upper surface of the n-GaN contact layer in the pn junction structure 101 peeled off from the substrate 100.

Next, the surface of the pn junction structure 101 closer to the substrate 100 is treated with diluted hydrochloric acid to remove gallium deposited on the upper surface of the pn junction structure 101. Then, a photoresist (not shown) is patterned into a 350 μm square on the pn junction structure 101, thereby forming an opening which exposes the pn junction structure 101.

Figure 5A:
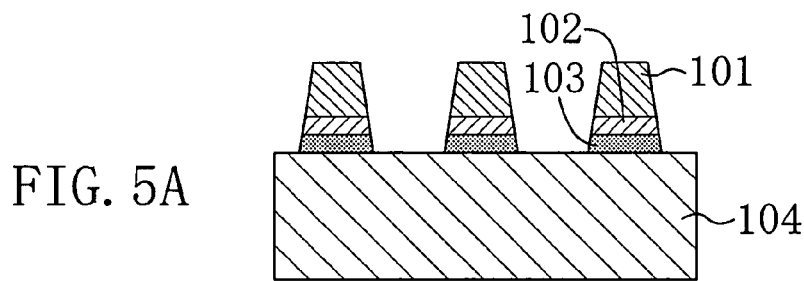
FIGS. 5A through 5E are cross sectional views of essential parts showing the last half of the steps of fabricating the semiconductor light-emitting device according to the first embodiment of the present invention.

Subsequently, the pn junction structure 101 is dry etched through the opening using the photoresist as a mask to remove a portion of the pn junction structure 101 that is present in the opening. As a result, as illustrated in FIG. 5A, a plurality of pn junction structures 101 are patterned, each of which has tapered side surfaces and a 350 μm square shape.

Figure 5B:
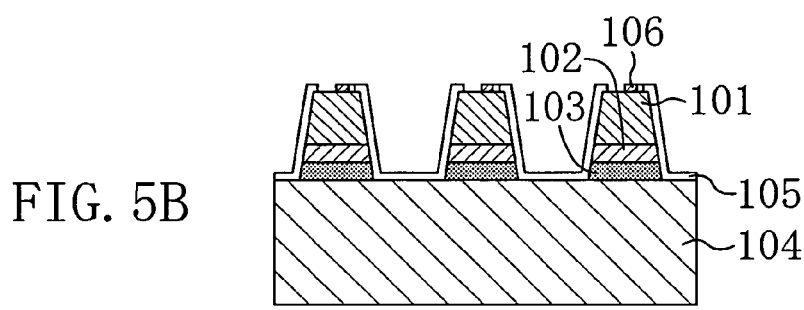

Next, as illustrated in FIG. 5B, the insulating film 105 having a thickness of 300 nm and made of SiO₂ film is formed on the side surfaces of the pn junction structures 101 and the portion of the support 104 not underlying the pn junction structures 101, and n-side ohmic electrodes 106 are formed on the pn junction structures 101, respectively.

In this manner, semiconductor light-emitting elements are formed in each of which the p-side ohmic electrode 102 is formed on the lower surface of the pn junction structure 101 and the n-side ohmic electrode 106 is formed on the upper surface thereof.

Figure 5C:
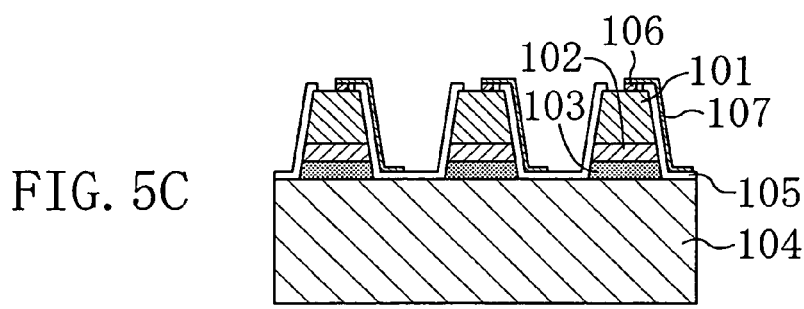

Next, as illustrated in FIG. 5C, wiring metals 107 are formed each to extend from the upper surface of the associated n-side ohmic electrode 106 on the upper surface of the associated pn junction structure 101 to above a portion of the upper surface of the support 104 not underlying the associated semiconductor light-emitting element with an insulating film 105 interposed therebetween. Each wiring metal 107 is formed by depositing a 50 nm thick Ti layer, a 100 nm thick Pt layer and a 300 nm thick Au layer.

Figure 5D:
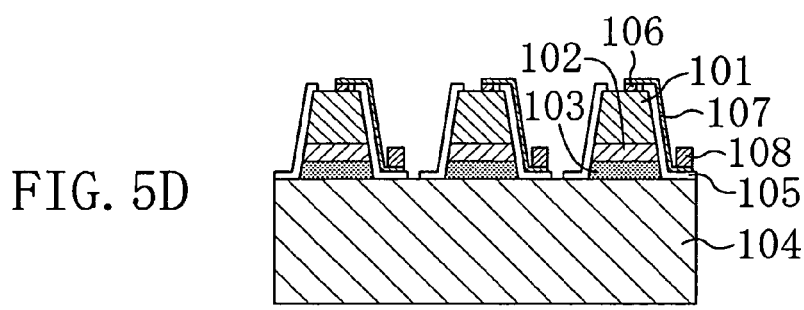

Next, as illustrated in FIG. 5D, an Au plating layer 108 is formed on a portion of each wiring metal 107 not underlying the semiconductor light-emitting element.

Figure 5E:
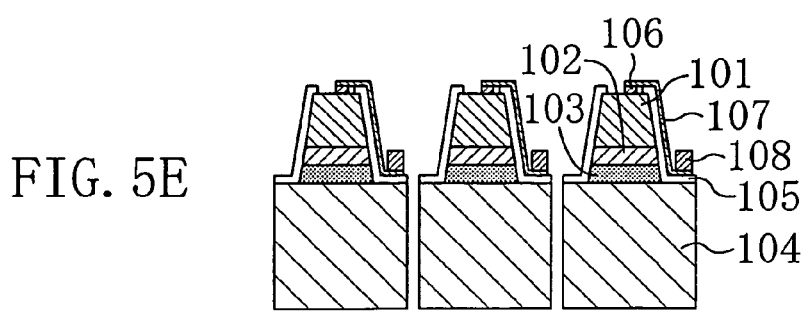

Next, as illustrated in FIG. 5E, the support 104 is diced for each semiconductor light-emitting element.

As mentioned above, according to the method for fabricating the semiconductor light-emitting device according to the first embodiment of the present invention, a wire will be bonded not to each semiconductor light-emitting element but to the portion of the support 104 not underlying the semiconductor light-emitting element. This enables the formation of the semiconductor light-emitting element fed with power through the associated wiring metal 107, not a bonding wire. Therefore, the semiconductor light-emitting device can be fabricated without applying pressure to the semiconductor light-emitting element. This makes it possible to prevent the fusion material 103 (e.g., AuSn), which is interposed between the support 104 and the semiconductor light-emitting element, from being deformed to cause cracking or chipping in the semiconductor light-emitting element by giving pressure to the semiconductor light-emitting element during wire bonding. As a result, the yield of semiconductor light-emitting devices can be enhanced.

In addition, a pad electrode can be formed not above the semiconductor light-emitting element but above a portion of the support 104 not underlying the semiconductor light-emitting element. Therefore, there is no need to form a pad electrode on a light extraction surface of the semiconductor light-emitting element. This increases the area of the effective light extraction surface of the semiconductor light-emitting element, thereby enhancing the light emission efficiency.

In the method for fabricating the semiconductor light-emitting device according to the first embodiment of the present invention, as illustrated in FIG. 5C, a wiring metal 107 is formed over one side surface of each semiconductor light-emitting element with an insulating film 105 interposed therebetween.

This makes it possible to surely prevent current from leaking through a portion of the wiring metal 107 formed on one side of the semiconductor light-emitting element. Therefore, current leakage can be reduced and thus the yield of semiconductor light-emitting devices can be further enhanced.

In the method for fabricating the semiconductor light-emitting device according to the first embodiment of the present invention, as illustrated in FIG. 4D, the surface of the substrate 100 opposite to the surface on which the pn junction structure 101 is formed is irradiated with pulsed YAG third harmonic laser (with a wavelength of about 355 nm).

Thus, the n-GaN contact layer 101f whose absorption edge wavelength is about 365 nm is irradiated with pulsed YAG third harmonic laser whose wavelength is about 355 nm. Therefore, the n-GaN contact layer 101f is decomposed by absorbing energy of the pulsed YAG third harmonic laser. As a result, the pn junction structure 101 can be peeled off from the substrate 100.

Note that in the semiconductor light-emitting device according to the first embodiment of the present invention and the method for fabricating the same, as illustrated in FIG. 1A, the wiring metal has a width Wa of 50 μm, but any other widths are acceptable. However, in the case of the wiring metal 107 having a width Wa of 5 μm or less, the portion of the wiring metal 107 formed over one side of the semiconductor light-emitting element will be broken or the wiring metal 107 will be broken due to heat generation in driving a current. Therefore, the width Wa of the wiring metal 107 is preferably 5 μm or more.

Moreover, in the method for fabricating the semiconductor light-emitting device according to the first embodiment of the present invention, as illustrated in FIG. 4B, the fusion material 103 is firstly formed on the pn junction structure 101 and then the pn junction structure 101 is bonded to the support 104 via the fusion material 103. However, the present invention is not limited to the above. Alternatively, the fusion material 103 may be firstly formed on the support 104 and then the pn junction structure 101 may be bonded to the support 104 via the fusion material 103.

Furthermore, in the method for fabricating the semiconductor light-emitting device according to the first embodiment of the present invention, as illustrated in FIG. 4C, the pn junction structure 101 is bonded to the support 104 via the fusion material 103, and then, as illustrated in FIG. 5A, the pn junction structure 101 is dry etched to form a patterned pn junction structure 101. However, the present invention is not limited to this order. Alternatively, before the pn junction structure 101 is bonded to the support 104 via the fusion material 103, the pn junction structure 101 may be dry etched to expose the substrate 100 and thereby forms a patterned pn junction structure 101. Then, the pn junction structure 101 is bonded to the support 104 via the fusion material 103.

Second Embodiment

Now, referring to FIGS. 6A and 6B, the structure of a semiconductor light-emitting device according to a second embodiment of the present invention will be described.

Figure 6A:
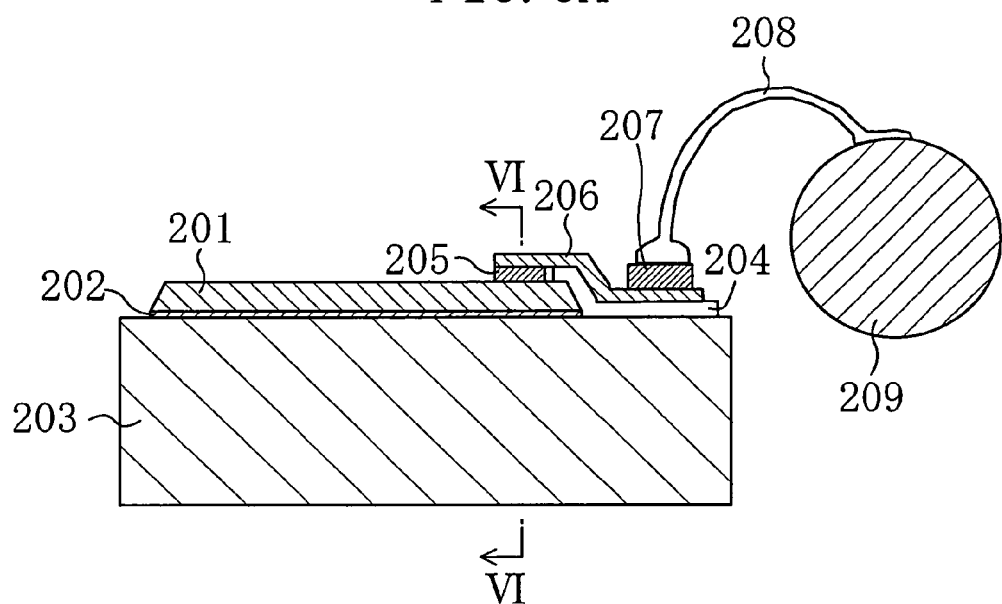
FIGS. 6A and 6B are diagrams showing the structure of a semiconductor light-emitting device according to a second embodiment of the present invention.
Figure 6B:
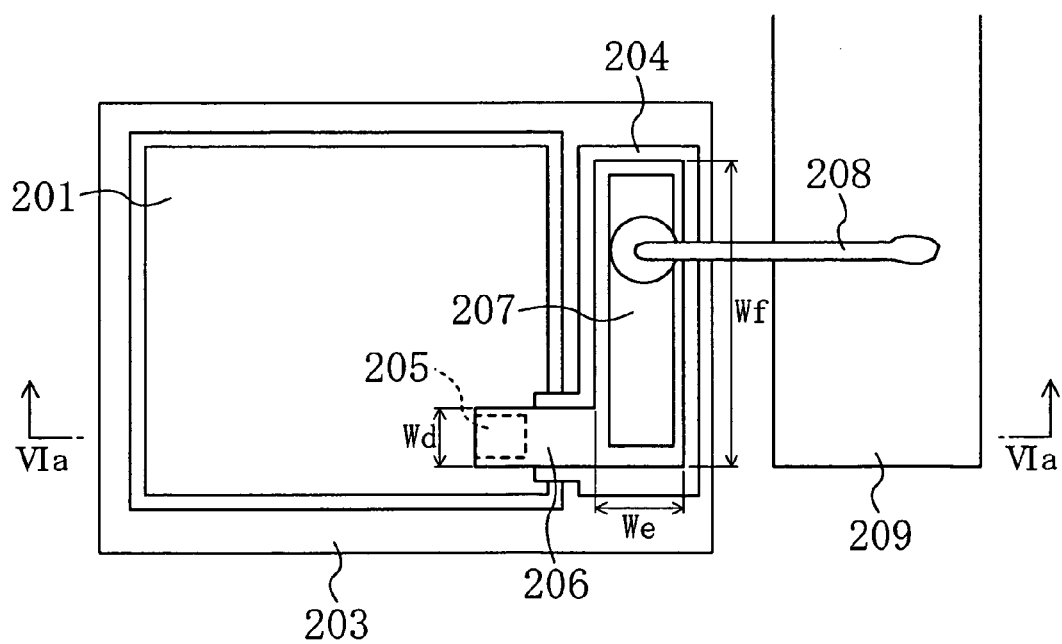

FIGS. 6A and 6B are diagrams showing the structure of the semiconductor light-emitting device according to the second embodiment of the present invention. FIG. 6A is a cross sectional view showing the structure of the semiconductor light-emitting device according to the second embodiment of the present invention, specifically, a cross sectional view taken along line VIa-VIa of FIG. 6B and FIG. 6B is a plan view showing the same.

As illustrated in FIG. 6A, a p-side ohmic electrode 202, a pn junction structure 201, and an n-side ohmic electrode 205 are sequentially formed on a support 203 which has a thickness of 100 μm and is made of Au. The pn junction structure 201 has a thickness of 5 μm and a 350 μm square shape, and comprises a semiconductor layer formed by sequentially depositing a p-type gallium nitride compound semiconductor layer, an active layer and an n-type gallium nitride compound semiconductor layer. Thus, a semiconductor light-emitting element is formed which includes the semiconductor layer (pn junction structure 201) and the adjoining p-side and n-side ohmic electrodes 202 and 205.

A wiring 206 is formed to extend from the upper surface of the n-side ohmic electrode 205 on top of the pn junction structure 201 to above a portion of the upper surface of the support 203 not underlying the semiconductor light-emitting element with an insulating film 204 made of a $SiO_2$ film interposed therebetween. In this manner, the insulating film 204 is formed between the support 203 and the wiring metal 206 and between the semiconductor light-emitting element and the wiring metal 206. The wiring metal 206 is a metal film formed by sequentially depositing a Ti layer of 50 nm, a Pt layer of 100 nm, and an Au layer of 300 nm. The wiring metal 206 electrically connects between the n-side ohmic electrode 205 and the below-mentioned Au plating layer 207.

The Au plating layer 207 having a thickness of 30 μm is formed on a portion of the wiring metal 206 formed straight above the upper surface of the support 203 with the insulating film 204 interposed therebetween. The Au plating layer 207 is electrically connected to a power supply pole 209 through an Au wire 208.

As illustrated in FIG. 6B, the p-side ohmic electrode (not shown) and the pn junction structure 201 are sequentially formed on the support 203, and the n-side ohmic electrode 205 is formed in the periphery of the upper surface of the pn junction structure 201. In this manner, on the support 203, the semiconductor light-emitting element is formed in which the p-side ohmic electrode (not shown) is formed on the lower surface of the pn junction structure 201 while the n-side ohmic electrode 205 is formed on the upper surface thereof.

The width Wd of the wiring metal 206 illustrated in FIG. 6B is about 50 μm. The wiring metal 206 is formed from the upper surface of the n-side ohmic electrode 205 to above the portion of the upper surface of the support 203 not underlying the semiconductor light-emitting element and is overlain by the insulating film 204.

The portion of the wiring metal 206 formed on the upper surface of the support 203 with the insulating film 204 interposed therebetween is patterned into a rectangle having a width We of 100 μm and a width Wf of 300 μm to form an electrode pad. The Au plating layer 207 having a thickness of 30 μm is formed on the electrode pad and electrically connected to the power supply pole 209 through the Au wire 208.

The semiconductor light-emitting device according to the second embodiment of the present invention allows the semiconductor light-emitting element to emit light by supplying current from the outside to the conductive support 203 made of Au and the power supply pole 209.

Note that the structure of the pn junction structure 201 of the semiconductor light-emitting device according to the second embodiment is identical with that of the pn junction structure 101 of the semiconductor light-emitting device according to the first embodiment, and thus the description is not repeated here.

As mentioned above, in the semiconductor light-emitting device according to the second embodiment of the present invention, the wire is bonded not to the semiconductor light-emitting element but to a portion of the support 203 not underlying the semiconductor light-emitting element. Therefore, the semiconductor light-emitting element is fed with power through the wiring metal 206, not a bonding wire. With this structure, the semiconductor light-emitting device can be fabricated without applying pressure to the semiconductor light-emitting element. Therefore, even when the support is made of a material having a hardness lower than sapphire, SiC or the like, it is possible to prevent the support 203 (e.g., Au) made of such a low hardness material from being deformed to cause cracking or chipping in the semiconductor light-emitting element by giving pressure to the semiconductor light-emitting element during wire bonding. As a result, the yield of semiconductor light-emitting devices can be enhanced.

In addition, the pad electrode can be formed not above the semiconductor light-emitting element but above a portion of the support 203 not underlying the semiconductor light-emitting element. There is no need to form a pad electrode on a light extraction surface of the semiconductor light-emitting element. This increases the area of the effective light extraction surface of the semiconductor light-emitting element, thereby enhancing the light emission efficiency.

In the semiconductor light-emitting device according to the second embodiment of the present invention, as shown in FIG. 6A, the insulating film 204 having a thickness of 300 nm and made of a SiO$_2$ film is formed between the wiring metal 206 and the semiconductor light-emitting element.

This surely prevents that current injected from the p-side ohmic electrode 202 to the p-type gallium nitride compound semiconductor layers flows into the n-type gallium nitride compound semiconductor layer through a portion of the wiring metal 206 formed on one side of the semiconductor light-emitting element to cause current leakage. Therefore, the yield of semiconductor light-emitting devices can be further enhanced.

Moreover, if, as in the second embodiment, the insulating film 204 having a thickness of 100 nm or more is formed, this surely prevents that even when a pin hole is formed in the insulating film, current leaks through the pin hole. Therefore, the yield of semiconductor light-emitting devices can be further enhanced.

Furthermore, as in the second embodiment, in the case where the support 203 is made of a conductive material (e.g., Au), the insulating film 204 is formed between the wiring metal 206 and the support 203. With this structure, the portion of the wiring metal 206 formed above the upper surface of the support 203 is prevented from leaking current to the support 203. Therefore, the yield of semiconductor light-emitting devices can be further enhanced.

Moreover, in the case where the support 203 is made of a material having high resistivity, current leakage through the portion of the wiring metal formed on the upper surface of the support can be effectively prevented. However, when, as in the second embodiment, the insulating film 204 is formed between the wiring metal 206 and the support 203, current leakage can be more surely prevented.

In the semiconductor light-emitting device according to the second embodiment of the present invention, as illustrated in FIGS. 6A and 6B, the semiconductor light-emitting element is bonded to the support 203 made of Au.

With this structure, the semiconductor light-emitting element is formed on the support 203 which functions as a heat sink. Therefore, a semiconductor light-emitting device having excellent heat dispersion property can be provided and thus the semiconductor light-emitting device can operate with high power.

In the semiconductor light-emitting device according to the second embodiment of the present invention, as illustrated in FIG. 6A, the angle between the portion of the upper surface of the support 203 not underlying the semiconductor light-emitting element and the adjacent side surface of the semiconductor light-emitting element is more than 90 degrees and less than 180 degrees.

With this structure, since the side surface of the semiconductor light-emitting element is tapered, the wiring metal 206 can have excellent step coverage. Therefore, a portion of the wiring metal 206 formed on the side surface of the semiconductor light-emitting element can be surely prevented from breaking. As a result, the yield of semiconductor light-emitting devices can be further enhanced.

In the semiconductor light-emitting device according to the second embodiment of the present invention, as described above, the pn junction structure 201 includes the n-type gallium nitride compound semiconductor layer 101$f$ in the upper side and with the p-type gallium nitride compound semiconductor layers 101$a$ to 101$c$ in the lower side.

With this structure, in the pn junction structure 201 formed by depositing the plurality of semiconductor layers, not the p-GaN contact layer 101$a$ but the n-GaN contact layer 101$f$ can be placed as the uppermost layer. Since the n-GaN contact layer has a smaller resistivity than the p-GaN contact layer, current injected into the n-type gallium nitride compound semiconductor layer through the n-side ohmic electrode 205 is easily diffused into the semiconductor layer (pn junction structure 201) as compared with the p-type gallium nitride compound semiconductor layer.

Thus, the n-side ohmic electrode 205 can be downsized and the ratio of the area of the n-side ohmic electrode 205 to the upper surface of the pn junction structure 201 can be reduced. Therefore, the area of the effective light extraction surface of the semiconductor light-emitting element can be increased, which further enhances the light emission efficiency in the semiconductor light-emitting device.

Moreover, since the p-side ohmic electrode 202 is formed on the lower surface of the pn junction structure 201, it can be formed not as a partial electrode but as a full-scale electrode. Therefore, current can be injected uniformly into the p-type gallium nitride compound semiconductor layer and thus non-uniform light emission can be prevented. This not only increases the light emission efficiency but provides a semiconductor light-emitting device exhibiting uniform and good light emission.

Now, referring to FIGS. 7A to 7D and 8A to 8E, a method for fabricating the semiconductor light-emitting device according to the second embodiment of the present invention will be described.

FIGS. 7A to 7D and 8A to 8E are cross sectional views of essential parts showing the steps of fabricating the semiconductor light-emitting device according to the second embodiment of the present invention.

Figure 7A:
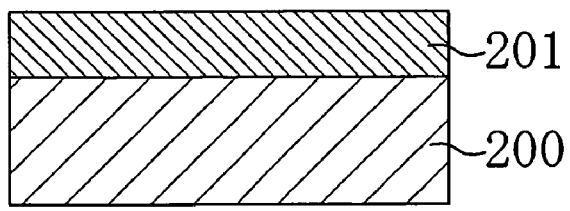
FIGS. 7A through 7D are cross sectional views of essential parts showing the first half of the steps of fabricating the semiconductor light-emitting device according to the second embodiment of the present invention.

As illustrated in FIG. 7A, a pn junction structure 201 is formed on the sapphire substrate 200. The pn junction structure 201 is a semiconductor layer formed by sequentially depositing an n-type gallium nitride compound semiconductor layer, an active layer, a p-type gallium nitride compound semiconductor layer through epitaxial growth.

Figure 7B:
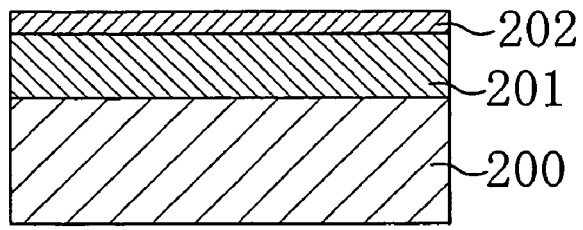

Next, as illustrated in FIG. 7B, a p-side ohmic electrode 202 is formed on the pn junction structure 201.

Figure 7C:
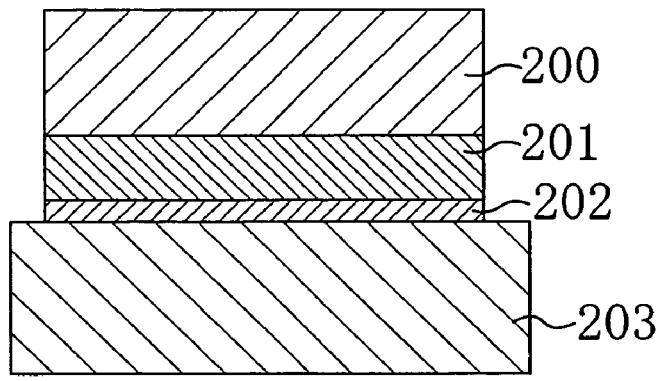

Next, as illustrated in FIG. 7C, a support 203 which has a thickness of 100 μm and is made of Au is formed by plating on the surface of the p-side ohmic electrode 202 opposite to the surface on which the pn junction structure 201 is formed.

Figure 7D:
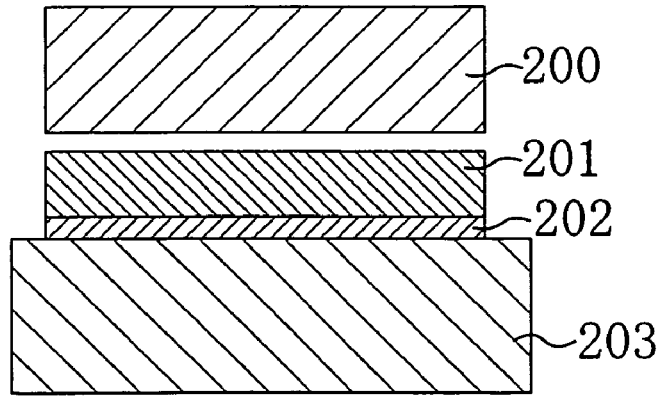

Next, as illustrated in FIG. 7D, the surface of the substrate 200 opposite to the surface thereof on which the pn junction structure 201 is formed is irradiated with pulsed YAG third harmonic laser (with a wavelength of about 355 nm) to scan the entire surface, thereby peeling off the pn junction structure 201 from the substrate 200.

As described above, the semiconductor layer constituting part of the pn junction structure 201 formed on the support 203 includes an n-GaN contact layer as the uppermost layer. The wavelength at the absorption edge of the n-GaN contact layer is about 365 nm. Therefore, in the step illustrated in FIG. 7D, the substrate 200 is irradiated with pulsed YAG third harmonic laser whose wavelength is about 355 nm. Thus, the n-GaN contact layer is decomposed by absorbing energy of the pulsed YAG third harmonic laser.

Since the laser lift-off technique is employed in the above manner, the n-GaN contact layer is decomposed at a location about 0.2 μm away from the interface between the pn junction structure 201 and the substrate 200, thereby peeling off the pn junction structure 201 from the substrate 200. Gallium is deposited on the upper surface of the n-GaN contact layer in the pn junction structure 201 peeled off from the substrate 200.

Next, the surface of the pn junction structure 201 closer to the substrate 200 is treated with diluted hydrochloric acid to remove gallium deposited on the upper surface of the pn junction structure 201. Then, a photoresist (not shown) pat- terned into a 350 μm square on the pn junction structure 201, thereby forming an opening which exposes the pn junction structure 201.

Figure 8A:
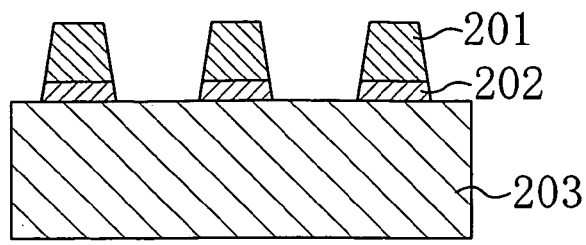
FIGS. 8A through 8E are cross sectional views of essential parts showing the last half of the steps of fabricating the semiconductor light-emitting device according to the second embodiment of the present invention.

Subsequently, the pn junction structure 201 is dry etched through the opening using the photoresist as a mask to remove a portion of the pn junction structure 201 that is present in the opening. As a result, as illustrated in FIG. 8A, a plurality of pn junction structures 201 are patterned each of which has tapered side surfaces and a square shape having a length of 350 μm.

Figure 8B:
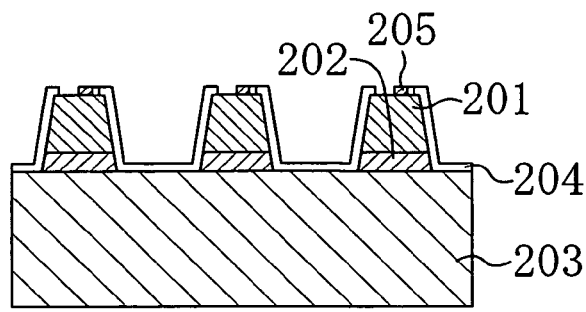

Next, as illustrated in FIG. 8B, the insulating film 204 having a thickness of 300 nm and made of $SiO_2$ film is formed on the side surfaces of the pn junction structures 201 and the portion of the support 203 not underlying the pn junction structures 201, and n-side ohmic electrodes 205 are formed on the pn junction structures 201, respectively.

In this manner, the semiconductor light-emitting elements are formed in each of which the p-side ohmic electrode 202 is formed on the lower surface of the pn junction structure 201 and the n-side ohmic electrode 205 is formed on the upper surface thereof.

Figure 8C:
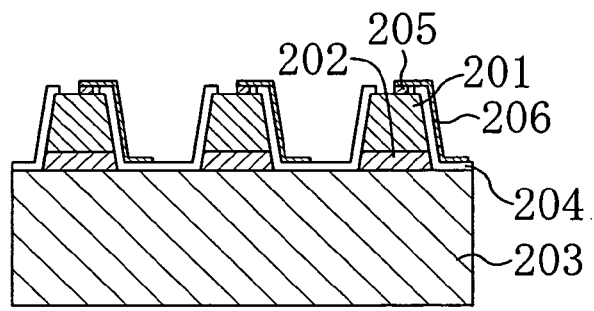

Next, as illustrated in FIG. 8C, wiring metals 206 are formed each to extend from the upper surface of the associated n-side ohmic electrode 205 on the upper surface of the associated pn junction structure 203 to above a portion of the support 203 not underlying the associated semiconductor light-emitting element with an insulating film 205 interposed therebetween. Each wiring metal 206 is formed by depositing a 50 nm thick Ti layer, a 100 nm thick Pt layer and a 300 nm thick Au layer.

Figure 8D:
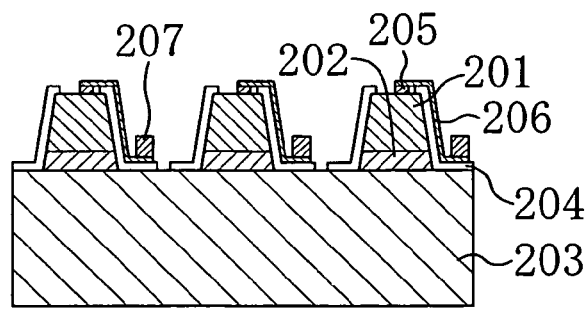

Next, as illustrated in FIG. 8D, an Au plating layer 207 is formed on a portion of each wiring metal 206 not underlying the semiconductor light-emitting element.

Figure 8E:
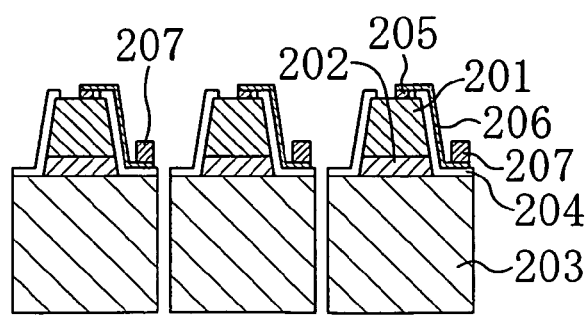

Next, as illustrated in FIG. 8E, the support 203 is diced for each semiconductor light-emitting element.

As mentioned above, according to the method for fabricating the semiconductor light-emitting device according to the second embodiment of the present invention, a wire will be bonded not to each semiconductor light-emitting element but to the portion of the support 203 not underlying the semiconductor light-emitting element. This enables the formation of the semiconductor light-emitting element fed with power through the associated wiring metal 206, not a bonding wire. Therefore, the semiconductor light-emitting device can be fabricated without applying pressure to the semiconductor light-emitting element. Therefore, even when the support is made of a material having a hardness lower than sapphire, SiC or the like, it is possible to prevent the support 203 (e.g., Au) made of such a low hardness material from being deformed to cause cracking or chipping in the semiconductor light-emitting element by giving pressure to the semiconductor light-emitting element during wire bonding. As a result, the yield of semiconductor light-emitting devices can be enhanced.

In addition, a pad electrode can be formed not above the semiconductor light-emitting element but above a portion of the support 203 not underlying the semiconductor light-emitting element. Therefore, there is no need to form a pad electrode on a light extraction surface of the semiconductor light-emitting element. This increases the area of the effective light extraction surface of the semiconductor light-emitting element, thereby enhancing the light emission efficiency.

In the method for fabricating the semiconductor light-emitting device according to the second embodiment of the present invention, as illustrated in FIG. 8C, a wiring metal 206 is formed over one side surface of each semiconductor light-emitting element with an insulating film 204 interposed therebetween.

This surely prevents that current injected from the p-side ohmic electrode 202 to the p-type gallium nitride compound semiconductor layers flows into the n-type gallium nitride compound semiconductor layer through a portion of the wiring metal 206 formed on one side of the semiconductor light-emitting element to cause current leakage. Therefore, the yield of semiconductor light-emitting devices can be further enhanced.

In the method for fabricating the semiconductor light-emitting device according to the second embodiment of the present invention, as illustrated in FIG. 7D, the surface of the substrate 200 opposite to the surface on which the pn junction structure 201 is formed is irradiated with pulsed YAG third harmonic laser (with a wavelength of about 355 nm).

Thus, the n-GaN contact layer 101f whose absorption edge wavelength is about 365 nm is irradiated with pulsed YAG third harmonic laser whose wavelength is about 355 nm. Therefore, the n-GaN contact layer is decomposed by absorbing energy of the pulsed YAG third harmonic laser. As a result, the pn junction structure 201 can be peeled off from the substrate 200.

Note that in the semiconductor light-emitting device according to the second embodiment of the present invention and the method for fabricating the same, the p-side ohmic electrode 202 is directly bonded to the support 203 of Au formed by plating, but the present invention is not limited to the structure. Alternatively, the p-side ohmic electrode may be fusion bonded to the support.

Moreover, in the semiconductor light-emitting device according to the second embodiment of the present invention and the method for fabricating the same, the support 203 has a thickness of 100 μm, but the support is not limited to the thickness. However, preferably, the support 203 has a thickness of 30 μm or more in consideration of ease of wafer handling. More preferably, the support 203 has a thickness of less than 1000 μm in consideration of ease of dicing the support 203 for each semiconductor light-emitting element and a manufacturing cost.

Note that in the semiconductor light-emitting device according to the second embodiment of the present invention and the method for fabricating the same, as illustrated in FIG. 6A, the wiring metal 206 has a width Wd of 50 μm, but any other widths are acceptable. However, in the case of the wiring metal 206 having a width Wd of 5 μm or less, the portion of the wiring metal 206 formed over one side of the semiconductor light-emitting element will be broken or the wiring metal 206 will be broken due to heat generation in driving a current. Therefore, the width Wa of the wiring metal 206 is preferably 5 μm or more.

Furthermore, in the method for fabricating the semiconductor light-emitting device according to the second embodiment of the present invention, as illustrated in FIG. 7C, the pn junction structure 201 is bonded to the support 203, and then, as illustrated in FIG. 8A, the pn junction structure 201 is dry etched to form a patterned pn junction structure 201. However, the present invention is not limited to this order. Alternatively, before the pn junction structure 201 is bonded to the support 203, the pn junction structure 201 may be dry etched to expose the substrate 200 and thereby forms a patterned pn junction structure 201. Then, the pn junction structure 201 is bonded to the support 203.

Third Embodiment

Now, referring to FIG. 9, the structure of a semiconductor light-emitting device according to a third embodiment of the present invention will be described.

Figure 9:
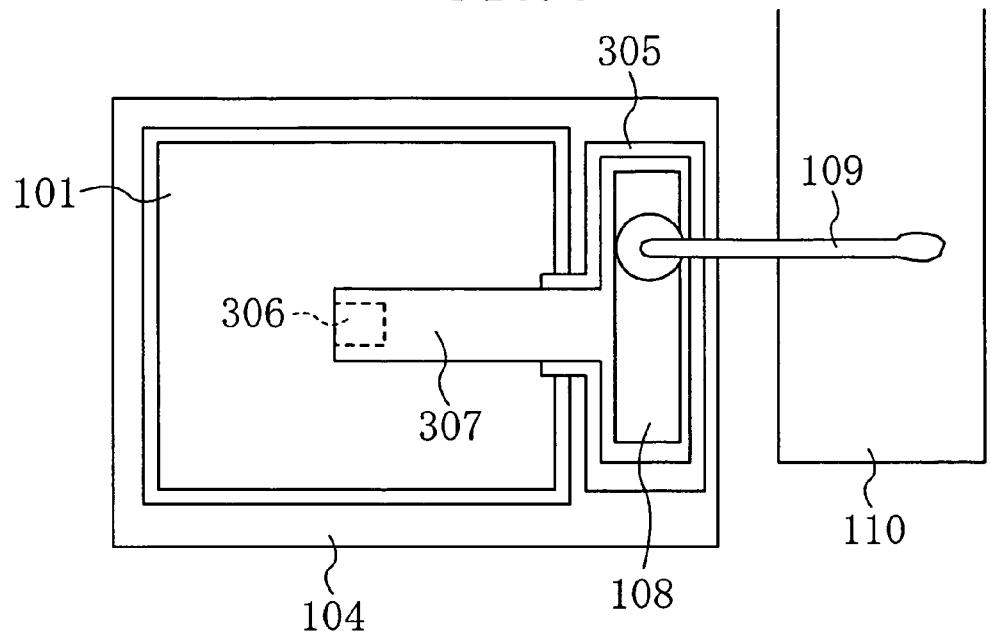
FIG. 9 is a plan view showing the structure of a semiconductor light-emitting device according to a third embodiment of the present invention.

FIG. 9 is a plan view of the structure of the semiconductor light-emitting device according to the third embodiment of the present invention.

As being identical with the cross sectional view of the structure of the semiconductor light-emitting device according to the first embodiment, the cross sectional view of the structure of the semiconductor light-emitting device according to the third embodiment of the present invention is omitted here. In FIG. 9, the same structural elements as in the semiconductor light-emitting device according to the first embodiment of the present invention are denoted by the same reference numerals. In the third embodiment, the same description as in the semiconductor light-emitting device according to the first embodiment of the present invention will not be repeated.

As illustrated in FIG. 9, a p-side ohmic electrode (not shown) and a pn junction structure 101 are sequentially formed on a support 104, and an n-side ohmic electrode 306 is formed on the center of the upper surface of the pn junction structure 101. Thus, on the support 104, a semiconductor light-emitting element is formed in which the p-side ohmic electrode (not shown) is formed on the lower surface of the pn junction structure 101 and the n-side ohmic electrode 306 is formed on the upper surface thereof.

A wiring metal 307 is formed to extend from the upper surface of the n-side ohmic electrode 306 to above a portion of the upper surface of the support 104 not underlying the semiconductor light-emitting element and interpose an insulating film 305.

In the semiconductor light-emitting device according to the third embodiment of the present invention, the n-side ohmic electrode 306 is formed on the upper surface of the pn junction structure 101 at or near the center thereof.

With this structure, the density of current flowing from the n-side ohmic electrode 306 to the active layer which forms the pn junction structure 101 is uniform in the surface of the active layer. As a result, light emission efficiency can be further enhanced in the semiconductor light-emitting device.

Now, referring to FIG. 10, the current to light output characteristic of the semiconductor light-emitting device according to the third embodiment of the present invention will be described.

Figure 10:
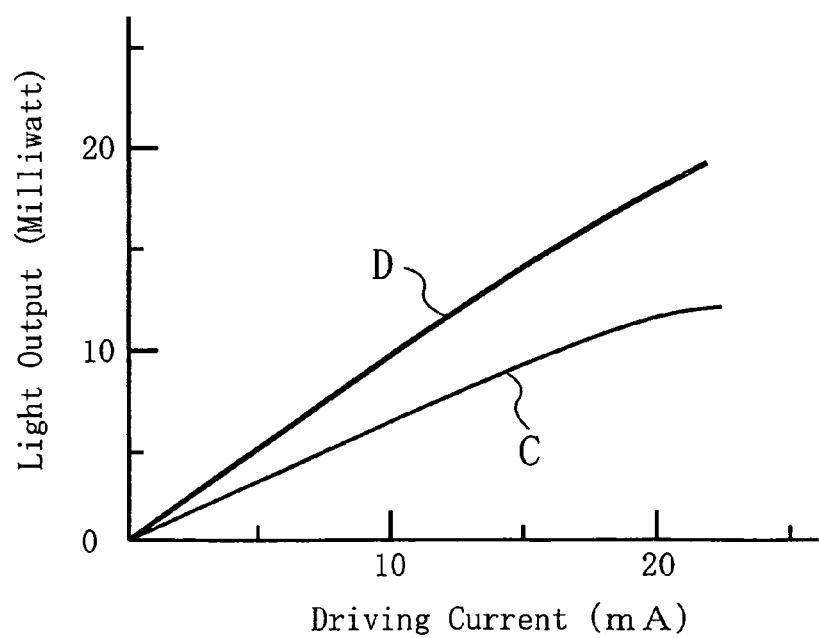
FIG. 10 is a diagram showing a change of a light output of the semiconductor light-emitting device with respect to a driving current.

FIG. 10 is a diagram showing changes of light output of the semiconductor light-emitting device with driving current.

A curve C of FIG. 10 shows changes of light output of the semiconductor light-emitting device in the case where the n-side ohmic electrode 106 is formed in the periphery of the upper surface of the pn junction structure 101 as described in the first embodiment, and a straight line D of FIG. 10 shows changes of light output of the semiconductor light-emitting device in the case where the n-side ohmic electrode 306 is formed on the center of the pn junction structure 101 as in the third embodiment.

As shown in FIG. 10, the value of the light output (milliwatt) with respect to a certain driving current (mA) obtained from the straight line D is larger than that of the light output obtained from the curve C.

Therefore, the n-side ohmic electrode formed as a partial electrode on the upper surface of the pn junction structure exhibits higher light output in the case of being formed on the center of the upper surface of the pn junction structure than in the case of being formed in the periphery thereof.

Since, in the semiconductor light-emitting device according to the third embodiment of the present invention, the n-side ohmic electrode 306 is formed on the upper surface of the pn junction structure at or near the center thereof as described above, the light emission efficiency can be further enhanced in the semiconductor light-emitting device.

Fourth Embodiment

Now, referring to FIG. 11, the structure of a semiconductor light-emitting device according to a fourth embodiment of the present invention will be described.

Figure 11:
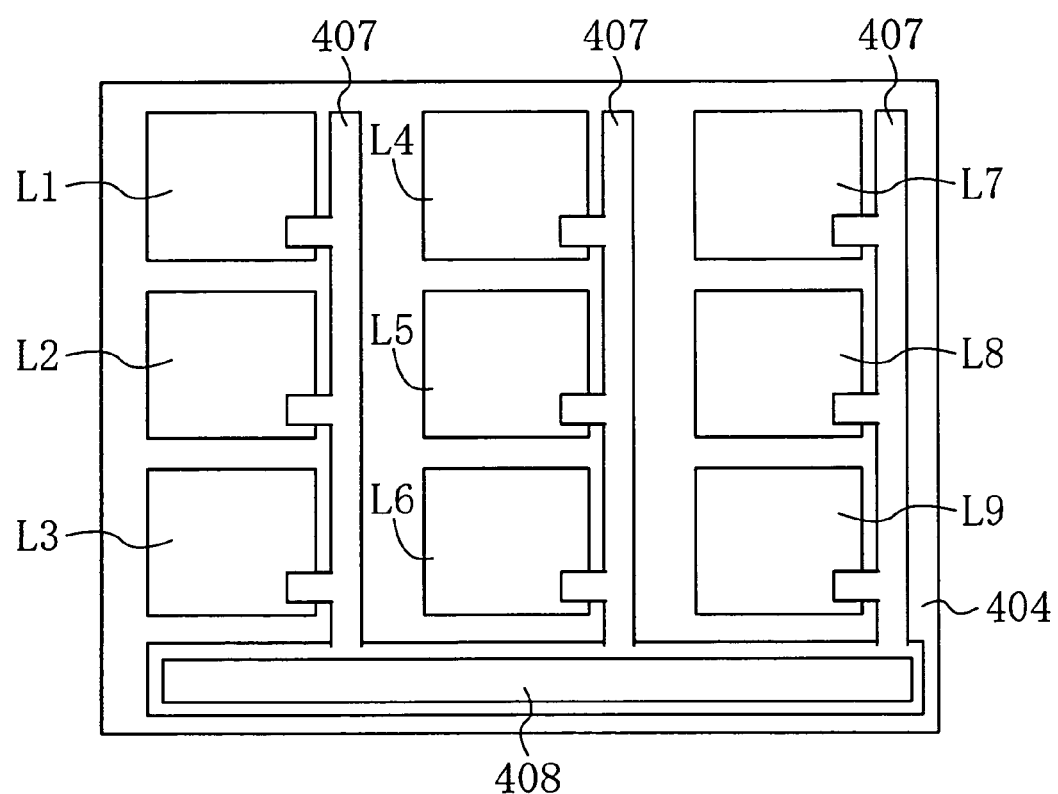
FIG. 11 is a plan view showing the structure of a semiconductor light-emitting device according to a fourth embodiment of the present invention.

FIG. 11 is a plan view illustrating the structure of the semiconductor light-emitting device according to the fourth embodiment of the present invention.

Note that as being identical with the cross sectional view of the structure of the semiconductor light-emitting device according to the first embodiment, the cross sectional view of the structure of the semiconductor light-emitting device according to the fourth embodiment of the present invention is omitted here.

As shown in FIG. 11, semiconductor light-emitting elements L1 to L9, each patterned into a square having a length of 350 are arranged in an array on a support 404 made of CuW with a fusion material (not shown) interposed therebetween.

Each of the semiconductor light-emitting elements L1 to L9 has a first electrode (not shown) and a second electrode (not shown). The upper part of each of the semiconductor light-emitting elements L1 to L9 is formed by one of the first and second electrodes and the lower part thereof is formed by the other. The electrode which forms the lower part of each of the semiconductor light-emitting elements L1 to L9 is bonded to the support 404 serving as a heat sink via the fusion material.

A wiring metal 407 is formed to extend from the upper surfaces of the electrodes forming the upper parts of the associated semiconductor light-emitting elements L1 to L9 to above a portion of the upper surface of the support 404 not underlying the associated semiconductor light-emitting elements L1 to L9 with an insulating film (not shown) interposed therebetween. An Au plating layer 408 is formed on the portion of the wiring metal 407 formed above the upper surface of the support 404 with the insulating film interposed therebetween. The Au plating layer 408 is electrically connected to a power supply part (not shown) through an Au wire (not shown). In this manner, the electrode forming the upper part of each of the semiconductor light-emitting elements L1 to L9 is electrically connected to the power supply part (not shown) through the common wiring metal 407.

As mentioned above, in the semiconductor light-emitting device according to the fourth embodiment of the present invention, the wire can be bonded not to the semiconductor light-emitting elements but to the portion of the support 404 not underlying the semiconductor light-emitting elements. With this structure, each of the semiconductor light-emitting elements L1 to L9 is fed with power through the common wiring metal 407, not a bonding wire. This makes it possible to prevent the fusion material (e.g., AuSn), which is interposed between the support 404 and the semiconductor light-emitting elements L1 to L9, from being deformed to cause cracking or chipping in the semiconductor light-emitting elements by giving pressure to the semiconductor light-emitting elements during manufacturing. As a result, regardless of the number of semiconductor light-emitting elements arranged in an array, the yield of semiconductor light-emitting devices can be enhanced.

Moreover, since each of the semiconductor light-emitting elements L1 to L9 is fed with power through the common wiring metal 407, there is no need to bond the wire to each of the semiconductor light-emitting elements. As a result, regardless of the number of semiconductor light-emitting elements arranged in an array, the yield of semiconductor light-emitting devices can be enhanced and the manufacturing cost can be reduced.

In addition, in the semiconductor light-emitting device according to the fourth embodiment of the present invention, the common pad electrode can be formed not on each of the semiconductor light-emitting elements but on the portion of the support 404 not underlying the semiconductor light-emitting elements. Therefore, there is no need to form a pad electrode on the upper surface of each semiconductor light-emitting element. This increases the area of the effective light extraction surface of the semiconductor light-emitting element, thereby further enhancing the light emission efficiency in each semiconductor light-emitting element.

Moreover, since the pn junction structure of each of the semiconductor light-emitting elements L1 to L9 has a large index of refraction, light arriving at the upper surface of each semiconductor light-emitting element at a certain angle or more is totally reflected therefrom. On the other hand, light arriving at the side surfaces of the semiconductor light-emitting element, regardless of the index of refraction of the pn junction structure, is not totally reflected therefrom. Therefore, in the semiconductor light-emitting device according to the fourth embodiment of the present invention, the arrangement of the plurality of semiconductor light-emitting elements in an array increases the ratio of the area of the side surfaces of all the semiconductor light-emitting elements to the light extraction surfaces of all the semiconductor light-emitting elements. As a result, light emission efficiency can be further enhanced.

Note that the fourth embodiment of the present invention has described the semiconductor light-emitting device including the semiconductor light-emitting elements L1 to L9 of a 350 μm square, but the size of the semiconductor light-emitting elements of the present invention is not limited to the square. Alternatively, each of the semiconductor light-emitting elements may have a square shape of 150 μm or less side length. In that case, the ratio of the area of the side surfaces of each semiconductor light-emitting element to the light extraction surface of the semiconductor light-emitting element can be increased. As a result, light emission efficiency can be further enhanced.

Moreover, the fourth embodiment of the present invention has described the semiconductor light-emitting device in which nine semiconductor light-emitting elements are arranged in an array, but the number of the semiconductor light-emitting elements is not limited to this.

Moreover, the fourth embodiment of the present invention has described the semiconductor light-emitting device in which each of the semiconductor light-emitting elements L1 to L9 has a square shape, but the semiconductor light-emitting element is not limited to the shape. Alternatively, the semiconductor light-emitting element may have any shape such as rectangle, parallelogram, triangle and circular.

Furthermore, the fourth embodiment of the present invention has described the semiconductor light-emitting device in which all the semiconductor light-emitting elements are connected in parallel, but the present invention is not limited to this arrangement. Alternatively, all the semiconductor light-emitting elements may be serially connected to each other or some groups of semiconductor light-emitting elements connected in parallel are serially connected to each other.

Fifth Embodiment

Now, referring to FIG. 12, the structure of a semiconductor light-emitting device according to a fifth embodiment of the present invention will be described.

Figure 12:
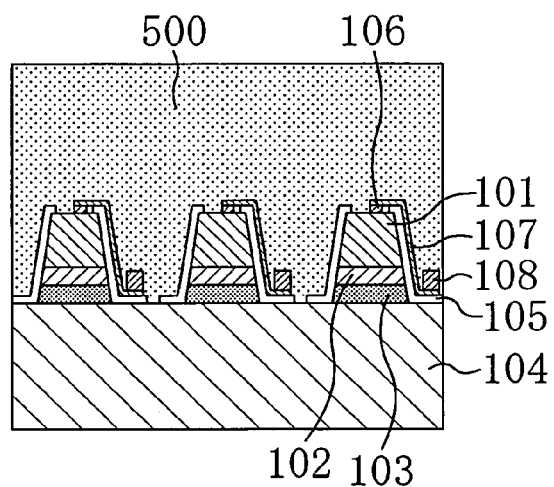
FIG. 12 is a cross sectional view showing the structure of a semiconductor light-emitting device according to a fifth embodiment of the present invention.

FIG. 12 is a cross sectional view illustrating the structure of the semiconductor light-emitting device according to the fifth embodiment of the present invention.

Note that in FIG. 12, the same structural elements as in the semiconductor light-emitting device according to the first embodiment of the present invention are denoted by the same reference numerals. In the fifth embodiment, the same description as in the semiconductor light-emitting device according to the first embodiment of the present invention will not be repeated.

As shown in FIG. 12, in the semiconductor light-emitting device according to the fifth embodiment of the present invention, a resin material 500 containing a phosphor is applied to the semiconductor light-emitting elements of the semiconductor light-emitting device according to the fourth embodiment.

An example of the phosphor contained in the resin material 500 is a phosphor which is excited by blue light emitted from the semiconductor light-emitting element to illuminate in yellow color, such as a YAG phosphor. In this case, a semiconductor light-emitting device emitting white light can be realized by mixing blue light from the semiconductor light-emitting element with yellow light from the phosphor.

In the semiconductor light-emitting device according to the fifth embodiment of the present invention, unlike the known art, the Au wire (not shown) is not broken by receiving pressure during the application of the resin material. Therefore, in the semiconductor light-emitting device according to the fifth embodiment of the present invention, semiconductor light-emitting devices can be fabricated with an extremely high yield.

Note that the fifth embodiment has described the semiconductor light-emitting device including the semiconductor light-emitting element whose luminescence wavelength is set at a wavelength of blue light, but the luminescence wavelength is not limited to this. Alternatively, the luminescence wavelength may be set at a wavelength of ultraviolet light of about 420 nm or less.

The fifth embodiment has described the semiconductor light-emitting device in which the phosphor contained in the resin material 500 is a YAG phosphor, but the phosphor is not limited to the phosphor. Alternatively, three type of phosphors emitting red, green and blue lights, respectively, may be mixed in the resin material.

In the semiconductor light-emitting devices according to the first to fifth embodiments of the present invention and the methods for fabricating the same, the insulating film is made of $SiO_2$, but the material is not limited to this. Alternatively, the insulating film may be made of SiN, $TiO_2$, $Nd_2O_5$, $Ta_2O_5$, $ZrO_2$ or the like or a multilayer film made of some or all of these materials.

In the semiconductor light-emitting devices according to the first to fifth embodiments of the present invention and the methods for fabricating the same, the support 104, 203 is made of CuW or Au, but the material is not limited to this. Alternatively, the support may be made of Cu, Al, SiC, Si, BN, MN or GaN.

In the methods for fabricating the semiconductor light-emitting device according to the first to fifth embodiments of the present invention, the contact layer forming the semiconductor layer is made of the n-GaN contact layer 101*f*, but the contact layer is not limited to this. Alternatively, the contact layer may be made of $In_xAl_yGa_{1-x-y}N$ ($0 \leq x \leq 1$, $0 \leq y \leq 1$, $0 \leq x+y \leq 1$).

In the methods for fabricating the semiconductor light-emitting device according to the first to fifth embodiments of the present invention, laser light emitted from a YAG third harmonic laser is used, but the laser light is not limited to this. Alternatively, laser light emitted from any one device selected from the group consisting of a KrF excimer laser and an ArF excimer laser may be used.

Sixth Embodiment

Now referring to FIG. 13, a lighting module including the semiconductor light-emitting device according to the present invention will be described.

Figure 13:
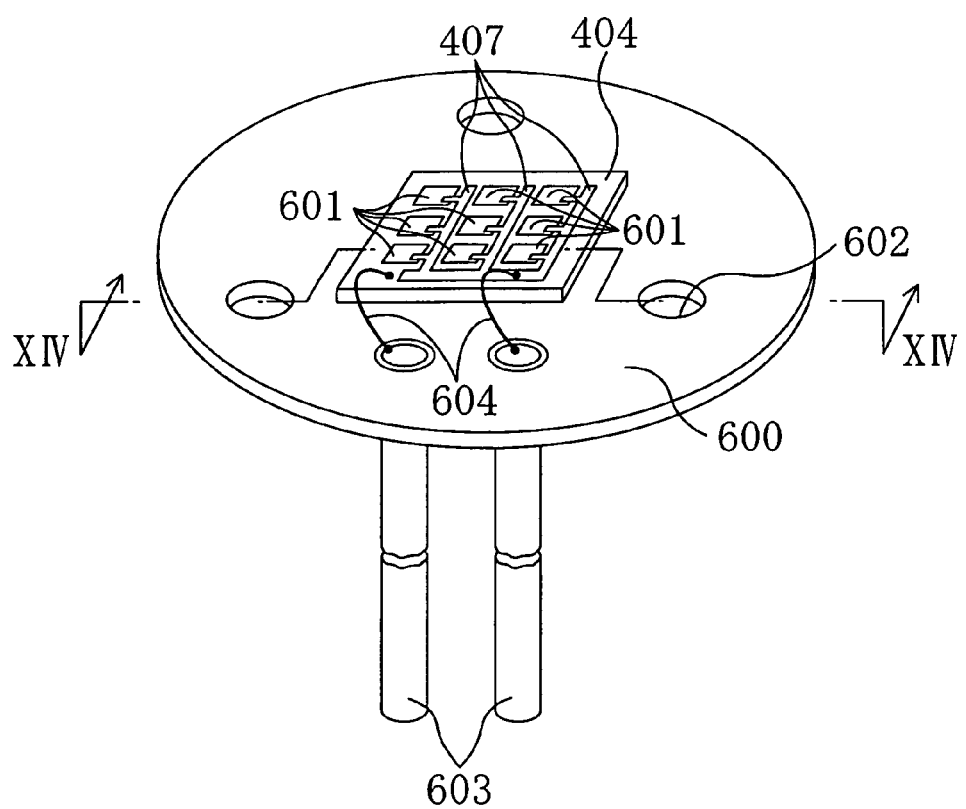
FIG. 13 is a perspective view showing a lighting module according to a sixth embodiment of the present invention.

FIG. 13 is a perspective view illustrating the structure of the lighting module according to a sixth embodiment of the present invention.

Note that in FIG. 13, the same structural elements as in the semiconductor light-emitting device according to the fourth embodiment of the present invention are denoted by the same reference numerals. In the sixth embodiment, the same description as in the semiconductor light-emitting device according to the fourth embodiment of the present invention will not be repeated.

As shown in FIG. 13, the support 404 is bonded to a heat sink 600 made of Al via an Ag paste (not shown) or a first fusion material (not shown). On the heat sink 600, a LED array 601 is formed in which the semiconductor light-emitting elements L1 to L9 are arranged in an array. The heat sink is formed with a plurality of mounting through holes 602 and is provided with power supply electrodes 603 electrically isolated from the conductive heat sink 600.

Each of the semiconductor light-emitting elements of the LED array 601 has a first electrode and a second electrode. First or second electrodes forming the upper parts of the semiconductor light-emitting elements are electrically connected to each other through the common wiring metal 407. The other electrodes forming the lower parts of the semiconductor light-emitting elements are bonded to the conductive support 404 via a second fusion material (not shown). The conductive support 404 and the wiring metal 407 are electrically connected to the power supply electrodes 603 through Au wires 604, respectively.

In the lighting module according to the sixth embodiment of the present invention, the LED array 601 can emit light by feeding a current to the conductive support 404 and the wiring metal 407 from the outside.

As mentioned above, in the lighting module according to the sixth embodiment of the present invention, each of the semiconductor light-emitting elements of the LED array 601 is fed with power through the common wiring metal 407, not a bonding wire. This makes it possible to prevent that the semiconductor light-emitting elements cause cracking or chipping by receiving pressure during wire bonding. As a result, the yield of semiconductor light-emitting devices forming the lighting module can be enhanced, and therefore, lighting modules can be fabricated with high yield.

Moreover, in the lighting module according to the sixth embodiment of the present invention, the semiconductor light-emitting device is bonded to the heat sink 600 via the first fusion material. With this structure, a lighting module having an excellent heat dispersion property can be realized and thus the lighting module can operate with high power.

Moreover, in the lighting module according to the sixth embodiment of the present invention, each of the semiconductor light-emitting elements L1 to L9 of the LED array 601 is bonded to the support 404 serving as a heat sink via the second fusion material. With this structure, a semiconductor light-emitting device having an excellent heat dispersion property can be realized and thus the semiconductor light-emitting device can operate with high power.

Now, referring to FIG. 14, a lighting apparatus including the semiconductor light-emitting device according to the present invention will be described.

Figure 14:
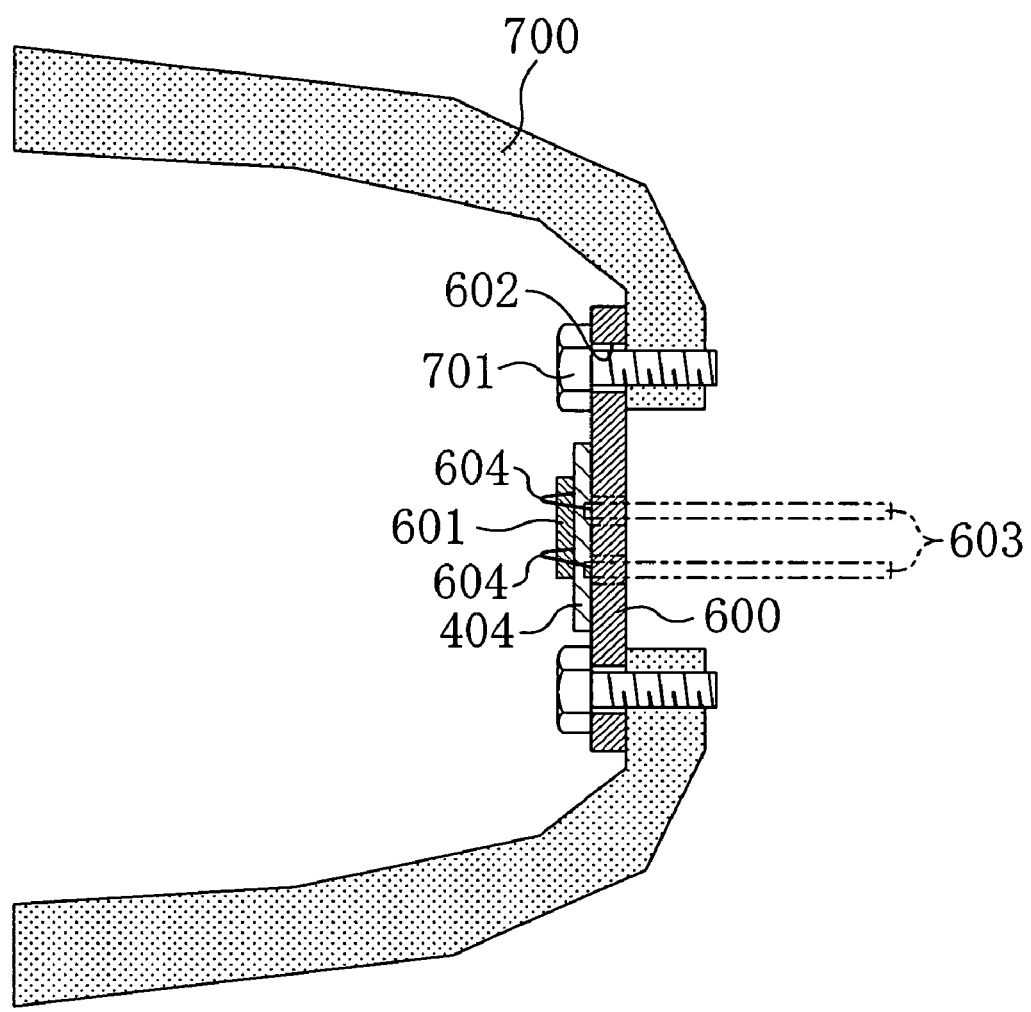
FIG. 14 is a cross sectional view showing the structure of a lighting apparatus according to the sixth embodiment of the present invention.
Figure 15:
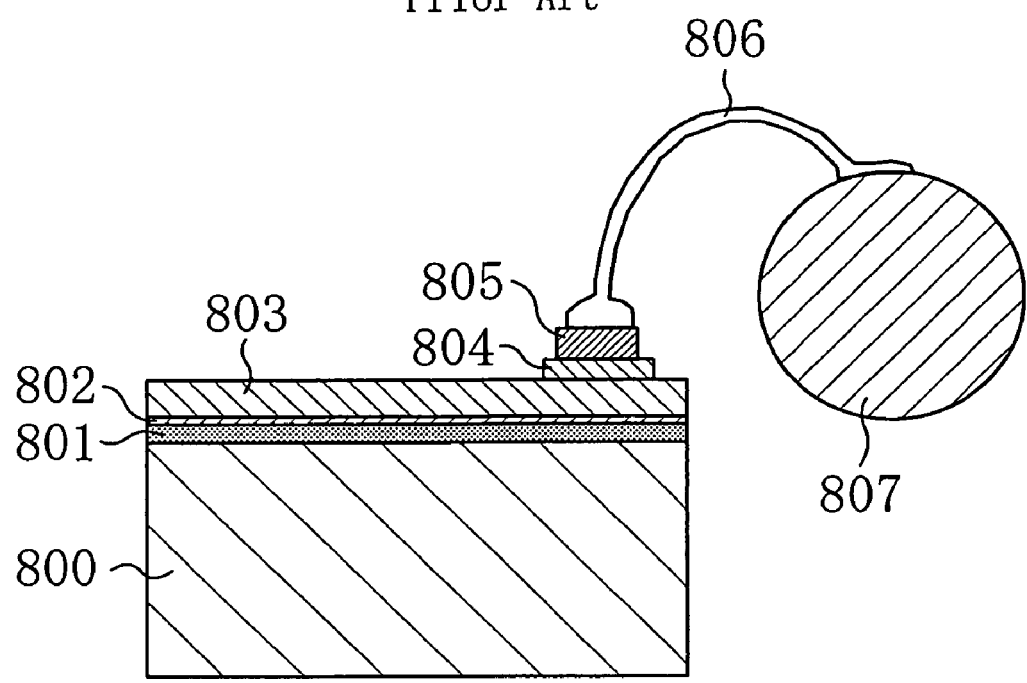
FIG. 15 is a cross sectional view of the structure of a conventional semiconductor light-emitting device.

FIG. 14 is a cross sectional view of the structure of the lighting apparatus according to the sixth embodiment of the present invention.

Note that in FIG. 14, the same structural elements as in the lighting module according to the sixth embodiment of the present invention are denoted by the same reference numerals. Here, the same description as in the lighting module according to the sixth embodiment of the present invention will not be repeated here.

As shown in FIG. 14, the lighting module according to the sixth embodiment of the present invention is fixed to a reflector 700 with a fixing screws 701 inserted in the mounting through holes 602. Note that the structure of the lighting module illustrated in FIG. 14 corresponds to a cross sectional view taken along line XIV-XIV of FIG. 13.

The lighting apparatus according to the sixth embodiment of the present invention, as mentioned above, employs the lighting module having an excellent heat dispersion property. Therefore, the lighting apparatus can operate with high power.

Note that in the lighting module and the lighting apparatus according to the sixth embodiment, the heat sink 600 is made of Al, but the material is not limited to this. Alternatively, the heat sink 600 may be made of metal such as Cu, Fe or stainless steel, ceramic such as AlN or $Al_2O_3$, or a multilayered structure made of metal and ceramic.

As described above, the present invention is useful for the semiconductor light-emitting device which is suitably applicable to the lighting field, and the method for fabricating the same.

What is claimed is:

1. A semiconductor light-emitting device, comprising:
   a support consisting of a metal material;
   a semiconductor light-emitting element bonded to the support and comprising a first electrode, a second electrode, and a semiconductor layer including at least an active layer and formed from a III-V nitride semiconductor layer, the first electrode being located on a lower surface of the semiconductor light-emitting element, and being electrically connected to the support, and the second electrode being located on an upper surface of the semiconductor light-emitting element opposite to the lower surface; and
   a patterned metal film formed to continuously extend over the second electrode overlying the semiconductor layer, a portion of a side surface of the semiconductor layer and a portion of an upper surface of the support not underlying the semiconductor light-emitting element,
   wherein the second electrode is fed with power through the metal film,
   a portion of the metal film formed on the support forms an electrode pad, the electrode pad is electrically connected to the second electrode and the portion of the metal film is electrically insulated from the support by an insulating film,
   the insulating film is formed on the support and on the side surface of the semiconductor layer, and the metal film is formed on the insulating film, and
   the semiconductor layer includes an n-type gallium nitride compound semiconductor layer, which is connected to the second electrode, in the upper side thereof, and a p-type gallium nitride compound semiconductor layer, which is connected to the first electrode, in the lower side thereof.

2. The semiconductor light-emitting device of claim 1, wherein the semiconductor light-emitting element is bonded to the support via a fusion material.

3. The semiconductor light-emitting device of claim 1, wherein a plurality of said semiconductor light-emitting elements are bonded to the support.

4. The semiconductor light-emitting device of claim 1, wherein the semiconductor layer has a thickness of 30 μm or less.

5. The semiconductor light-emitting device of claim 1, wherein the insulating film has a thickness of 100 nm or more.

6. The semiconductor light-emitting device of claim 1, wherein the insulating film is a film made of any one material selected from the group consisting of $SiO_2$, SiN, $TiO_2$, $Nd_2O_5$, $Ta_2O_5$, and $ZrO_2$, or a multilayer film made of materials selected from the group.

7. The semiconductor light-emitting device of claim 2, wherein the fusion material is made of PbSn, AuSn, AgSn or InSn.

8. The semiconductor light-emitting device of claim 1, wherein the support is one of Cu, Al, Au and CuW.

9. The semiconductor light-emitting device of claim 1, wherein the angle between a portion of the upper surface of the support not underlying the semiconductor light-emitting element and a side surface of the semiconductor light-emitting element is more than 90 degrees and less than 180 degrees.

10. The semiconductor light-emitting device of claim 1, wherein said second electrodes formed on the upper surface of the semiconductor layer is formed on the upper surface of the semiconductor layer at the center thereof.

11. The semiconductor light-emitting device of claim 1, wherein a resin material containing a phosphor excited by light emitted from the semiconductor light-emitting element is formed on a surface of the semiconductor light-emitting element.

12. A lighting apparatus comprising a lighting module having a semiconductor light-emitting device, the semiconductor light-emitting device comprising:
   a support consisting of a metal material;
   a semiconductor light-emitting element bonded to the support and comprising a first electrode, a second electrode, and a semiconductor layer including at least an active layer and formed from a III-V nitride semiconductor layer, the first electrode being located on a lower surface of the semiconductor light-emitting element, and being electrically connected to the support, and the second electrode being located on an upper surface of the semiconductor light-emitting element opposite to the lower surface; and
   a patterned metal film formed to continuously extend over the second electrode overlying the semiconductor layer, a portion of a side surface of the semiconductor layer and a portion of an upper surface of the support not underlying the semiconductor light-emitting element,
   wherein the second electrode is fed with power through the metal film, and
   a portion of the metal film formed on the support forms an electrode pad, the electrode pad is electrically connected to the second electrode and the portion of the metal film is electrically insulated from the support by an insulating film,
   the insulating film is formed on the support and on the side surface of the semiconductor layer, and the metal film is formed on the insulating film, and
   the semiconductor layer includes an n-type gallium nitride compound semiconductor layer, which is connected to the second electrode, in the upper side thereof, and a p-type gallium nitride compound semiconductor layer, which is connected to the first electrode in the lower side thereof.

13. The semiconductor light-emitting device of claim 1, further comprising an insulating film, wherein:
   a lower surface of the insulating film continuously extends over and connects to the portion of the side surface of the semiconductor layer and the portion of the upper surface of the support not underlying the semiconductor light-emitting element, and
   a lower surface of the patterned metal film continuously extends over and connects to the upper surface of the insulating film.

14. The lighting apparatus of claim 12, further comprising an insulating film, wherein:
   a lower surface of the insulating film continuously extends over and connects to the portion of the side surface of the semiconductor layer and the portion of the upper surface of the support not underlying the semiconductor light-emitting element, and
   a lower surface of the patterned metal film continuously extends over and connects to the upper surface of the insulating film.

15. The semiconductor light-emitting device of claim 1, wherein a wire-bonding area is disposed over the electrode pad.

16. The semiconductor light-emitting device of claim 1, wherein the electrode pad is disposed on the portion of the upper surface of the support not underlying the semiconductor light-emitting element.

17. The lighting apparatus of claim 12, wherein a wire-bonding area is disposed over the electrode pad.

18. The lighting apparatus of claim 12, wherein the electrode pad is disposed on the portion of the upper surface of the support not underlying the semiconductor light-emitting element.

19. The semiconductor light-emitting device of claim 1, wherein the semiconductor light-emitting element bonded to the support without interposing the insulating film.

20. The lighting apparatus of claim 12, wherein the semiconductor light-emitting element bonded to the support without interposing the insulating film.

21. The semiconductor light-emitting device of claim 1, wherein the insulating film is in contact with the support.

22. The lighting apparatus of claim 12, wherein the insulating film is in contact with the support.

* * * * *